US008129078B2

United States Patent
Imai et al.

(10) Patent No.: US 8,129,078 B2
(45) Date of Patent: Mar. 6, 2012

(54) MASK, METHOD FOR MANUFACTURING THE SAME, AND METHOD FOR MANUFACTURING SEMICONDUCTOR DEVICE

(75) Inventors: Akira Imai, Tokyo (JP); Junjiro Sakai, Tokyo (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/716,665

(22) Filed: Mar. 3, 2010

(65) Prior Publication Data

US 2010/0227444 A1 Sep. 9, 2010

(30) Foreign Application Priority Data

Mar. 6, 2009 (JP) .................... 2009-053651

(51) Int. Cl.
*G03F 1/00* (2006.01)
*G03C 5/00* (2006.01)
(52) U.S. Cl. ........................... 430/5; 430/394
(58) Field of Classification Search ............... 430/5, 394
See application file for complete search history.

(56) References Cited

U.S. PATENT DOCUMENTS 7,943,274 B2 * 5/2011 Yang et al. .............. 430/5
2006/0190850 A1 * 8/2006 Kohle et al. ............... 716/2

OTHER PUBLICATIONS

L. Pang et al., "Validation of Inverse Lithography Technology (ILT) and Its Adaptive SRAF at Advanced Technology Nodes" Proc. of SPIE vol. 6924, 69240T-1-12, (2008).

* cited by examiner

*Primary Examiner* — Stephen Rosasco
(74) *Attorney, Agent, or Firm* — McDermott Will & Emery LLP

(57) ABSTRACT

A mask having mask patterns for the transfer of a desired circuit pattern, a method for manufacturing the mask, and a semiconductor device manufacturing method using the mask, are provided. There are extracted two rectangular aperture patterns which are adjacent each other in an obliquely disposed state with respect to an X axis in an XY plane. The thus-extracted two rectangular aperture patterns are rotated at a certain angle so that a pattern edge corresponding to one side of one of the rectangular aperture patterns and a pattern edge corresponding to one side of the other rectangular aperture pattern are opposed in parallel to each other. The two rectangular aperture patterns thus rotated at a certain angle are then subjected to optical proximity effect correction to form two corrected rectangular aperture patterns.

5 Claims, 20 Drawing Sheets

32 (28a)   33 (25)   31 (28b)

US 8,129,078 B2

MASK, METHOD FOR MANUFACTURING THE SAME, AND METHOD FOR MANUFACTURING SEMICONDUCTOR DEVICE

CROSS-REFERENCE TO RELATED APPLICATIONS

The disclosure of Japanese Patent Application No. 2009-53651 filed on Mar. 6, 2009 including the specification, drawings and abstract is incorporated herein by reference in its entirety.

BACKGROUND OF THE INVENTION

The present invention relates to a mask, a method for manufacturing the same, and a method for manufacturing a semiconductor device. Particularly, the present invention is concerned with a mask for forming hole patterns such as contact holes, a method for manufacturing such a mask, and a semiconductor device manufacturing method including a hole forming step.

In manufacturing a semiconductor device, a semiconductor element and wiring are formed by repeating for example the steps of forming a certain film on a semiconductor substrate and performing a certain processing, e.g., etching, for the film. Before the processing, a resist pattern is formed on a certain substrate by a lithography step. Therefore, in the lithography step it is important to form a highly accurate resist pattern so that desired pattern size and shape are obtained by such a processing as etching.

With fine patterning, there is a tendency that a discrepancy in shape and size of the resist pattern relative to the shape and size of a design pattern becomes larger. In manufacturing a mask, therefore, an OPC (Optical Proximity effect Correction) processing is performed as a processing for correcting a design layout pattern so that there are obtained desired resist pattern shape and size. Usually, in the OPC processing, an edge of a design layout pattern is divided into plural edges and the thus-divided edges are each moved in parallel with an X- or Y-axis direction.

Since such an OPC processing is performed, particularly as the shape of an aperture pattern, there generally is employed a rectangular shape comprising pattern edges parallel to X and Y axes. In the case of the OPC processing or a biasing process, the size of an aperture pattern is varied by moving sides of the pattern in parallel with an X or Y axis.

As a design layout pattern correcting process there also is known a technology called Inverse Lithography Technology (Non-Patent Literature 1) in addition to the OPC processing. However, this technology involves the problem that an optimum mask pattern is very complicated in shape and that therefore the manufacture of a mask becomes more difficult. Accordingly, utility is enhanced by approximation using a simpler mask pattern shape.

[Non-Patent Literature 1]
Linyong Pang, et al.: "Validation of Inverse Lithography Technology (ILT) and Its Adaptive SRAF at Advanced Technology Nodes" Proc. Of SPIE., Vol. 6924, 69240T-1 (2008)

SUMMARY OF THE INVENTION

With fine patterning of device, a demand exists also for fine patterning of the hole pattern pitch. In lithography for 32 nm node, a patterning of 90 nm or so is required as a minimum pitch. Generally, in the lithography process, a resolution R is represented by the following equation, given that λ is the wavelength of exposure light, NA is a numerical aperture of an exposure tool, and k is a process-dependent parameter:

$$R = k \cdot (\lambda/NA)$$

where the smaller the value of the resolution R, the higher the resolution R. Thus, for enhancing the resolution R, it is necessary to shorten the exposure light wavelength λ, or increase the value of numerical aperture NA, or make the process-dependent parameter k smaller. However, since the process-dependent parameter k approaches a theoretical limit value, it is necessary to either shorten the exposure light wavelength λ or increase the value of numerical aperture NA.

In the technical field concerned the resolution has so far been improved by shortening the exposure light wavelength and increasing the value of NA. The exposure light wavelength has so far been shortened to 193 nm of ArF excimer laser light, but the practical application of the exposure technique using a still shorter wavelength of EUV light (wavelength 13.5 nm) will take more time. For this reason, improvements are being made for enhancing the resolution R by further increasing the value of NA without adopting the technique of shortening the exposure light wavelength.

More particularly, a technique of increasing the value of NA with use of an immersion exposure tool is being developed. In the case of a so-called dry exposure tool, the refractive index of air is 1, so it is said that a numerical aperture NA of 0.93 or so is an upper limit of NA. In an immersion exposure tool, however, the value of NA can be increased to 1.35 by replacing the air present between a projection lens and a substrate with water (refractive index=1.44).

In connection with the above lithography for 32 nm node, studies are being made about the application of an ArF immersion exposure tool (numerical aperture NA=1.3–1.35, reduction ratio 4:1) and RET (Resolution Enhancement Technology).

In the case of line and space patterns (L/S patterns), it tends to be a larger process margin at a line/space duty ratio around 1:1. On the other hand, in the case of such a hole pattern as a contact hole pattern, for example in case of transferring a hole pattern with a resist size of 70 nm by use of a halftone phase shifting mask, the aperture pattern size in the mask is set at about 80-90 nm which is larger than the aperture size in the resist.

This is for first ensuring a transfer margin of a resist pattern. Further, in connection with the mask aperture pattern, unless the aperture size is larger than a certain degree, the absolute light intensity of exposure light reaching a surface of a substrate becomes small, with consequent prolongation of exposure time, lowering of throughput and easy influence of flare, etc. As a result, there might be deterioration of resolving characteristics. A second reason for setting the aperture pattern size at the above value is for avoiding the occurrence of this problem.

As noted above, in a fine pattern region there is performed OPC processing to obtain a desired pattern transfer accuracy, but in the case of a rectangular aperture pattern having pattern edges parallel to X and Y axes, respectively, the aperture size is changed by moving the pattern edges in parallel with an X or Y axis. First, in an example of a halftone phase shifting mask, a mask is fabricated by etching a halftone (slightly transparent) film such as molybdenum silicide formed on a surface of a quartz glass substrate into a desired pattern.

At this time, as to mutually adjacent patterns, it is necessary that an edge of one pattern and an edge of the other pattern be spaced apart a certain minimum manufacturable distance or more so as to fabricate mask patterns. This value depends on the mask manufacturing process or the size and shape of adjacent patterns. However, in the case where sides of two figures are adjacent each other, there sometimes is used a value of about 30 nm or more in terms of an on-mask dimension.

As a layout mode of adjacent aperture patterns there is a layout (oblique layout) mode at an oblique angle of, say, 45° or so relative to an X axis, in addition to the parallel layout relative to an X or Y axis. This oblique layout is often adopted for example in a layout relation between a contact formed in transistor source-drain regions and a contact formed in transistor gate wiring.

Particularly, if an attempt is made to let obliquely-disposed adjacent aperture patterns approach each other, a corner of one aperture pattern and a corner of the other aperture pattern come closest to each other. In this condition, even if an attempt is made to expand those aperture patterns, the adjacent aperture patterns can be drawn close to each other or expanded only until the spacing between the one corner and the other corner becomes a minimum manufacturable spacing. As a result, a problem is encountered such that it is impossible to make expansion up to an aperture pattern of a size necessary for forming a desired resist pattern.

The present invention has been accomplished for solving the above-mentioned problem and it is an object of the invention to provide a mask having mask patterns for the transfer of a desired circuit pattern. It is another object of the invention to provide a method for manufacturing such a mask. It is a further object of the invention to provide a method for manufacturing a semiconductor device having hole patterns.

The mask according to the present invention is a mask for transferring mask patterns to a photosensitive material film (e.g., photoresist) formed on a substrate and it comprises a substrate having a main surface and mask patterns. The mask patterns is formed over the main surface of the substrate and includes two adjacent rectangular mask aperture patterns disposed at a certain pitch. If the main surface of the substrate is assumed to be an XY plane defined by an X axis and a Y axes orthogonal to the X axis, the two rectangular mask aperture patterns are disposed in such a manner that a line segment joining the centers of the two rectangular mask aperture patterns is inclined with respect to the X axis and that a pattern edge corresponding to one side of one of the rectangular mask aperture patterns and a pattern edge corresponding to one side of the other rectangular mask aperture pattern are opposed in parallel to each other and are inclined with respect to the X axis.

The mask manufacturing method according to the present invention is a method for manufacturing a mask which is for transferring mask patterns to a photosensitive material film (e.g., photoresist) formed on a substrate and it comprises the following steps. As design patterns, out of rectangular aperture patterns having pattern edges parallel to an X axis and pattern edges parallel to a Y axis orthogonal to the X axis in an XY plane defined by the X and Y axes, there are extracted two rectangular aperture patterns adjacent each other in a state in which a line segment joining the center of one rectangular aperture pattern and the center of the other rectangular aperture pattern is inclined with respect to the X axis. The thus-extracted two rectangular aperture patterns are each rotated at a certain angle in such a manner that a pattern edge corresponding to one side of the one rectangular aperture pattern and a pattern edge corresponding to one side of the other rectangular aperture patterns are opposed in parallel to each other. The two rectangular aperture patterns each thus rotated at a certain angle are subjected to optical proximity correction to form corrected aperture patterns. Then, on the basis of the two corrected aperture patterns there is performed electron beam exposure for a photosensitive resist film for electron beam exposure stacked on a mask member formed on a certain substrate, thereby forming rectangular mask aperture patterns corresponding to the two corrected aperture patterns.

The semiconductor device manufacturing method according to the present invention comprises the following steps. A first conductive region and a second conductive region are formed in certain regions of a semiconductor substrate. An insulating film is formed over a main surface of the semiconductor substrate so as to cover the first and second conductive regions. A photosensitive material film is stacked over the insulating film. The photosensitive material film is subjected to both exposure treatment and development treatment with use of a mask having two adjacent rectangular mask aperture patterns formed at a certain pitch, thereby forming apertures corresponding to the mask aperture patterns in the photosensitive resist material film. Using as a mask the photosensitive resist material film formed with apertures, the insulating film is etched to form a first contact hole to which the first conductive region is exposed and a second contact hole to which the second conductive region is exposed. A certain conductive material is formed in each of the interior of the first contact hole and the interior of the second contact hole. In the photolithography step of forming apertures in the photosensitive resist material film there is used a mask having two rectangular aperture patterns as the mask formed with mask aperture patterns, the mask having two rectangular aperture patterns being disposed in such a manner that if the mask surface is made an XY plane defined by an X axis and a Y axis orthogonal to the X axis, a line segment joining the centers of the two rectangular mask aperture patterns is inclined with respect to the X axis and that a pattern edge corresponding to one side of one of the rectangular mask aperture patterns and a pattern edge corresponding to one side of the other rectangular mask aperture pattern are opposed in parallel to each other and are inclined with respect to the X axis.

According to the mask related to the present invention, two adjacent rectangular mask aperture patterns are disposed in such a manner that if the substrate main surface is an XY plane defined by an X axis and a Y axis orthogonal to the X axis, a line segment joining the centers of the two rectangular mask aperture patterns is inclined with respect to the X axis and that a pattern edge corresponding to one side of one of the rectangular mask aperture patterns and a pattern edge corresponding to one side of the other rectangular mask aperture pattern are opposed in parallel to each other and are inclined with respect to the X axis. Consequently, the aperture patterns formed over the mask can be made larger in size, affording a sufficient light intensity, and the contrast of an optical image can also be improved, thus making it possible to attain both improvement of resolution and expansion of the process margin.

According to the mask manufacturing method related to the present invention, two adjacent rectangular aperture patterns are each rotated at a certain angle in a state in which a pattern edge corresponding to one side of one of the rectangular aperture patterns and a pattern edge corresponding to one side of the other rectangular aperture pattern are opposed in parallel to each other, and are subjected to optical proximity correction. As a result, the size of each aperture pattern after the correction can be made larger, whereby there are obtained both desired resist pattern size and sufficient light intensity.

According to the semiconductor device manufacturing method related to the present invention there is used a mask having two adjacent rectangular mask aperture patterns, the mask aperture patterns being disposed in such a manner that a line segment joining the centers of the two adjacent rectangular mask aperture patterns is inclined with respect to an X axis and that a pattern edge corresponding to one side of one of the rectangular mask aperture patterns and a pattern edge corresponding to one side of the other rectangular mask aperture pattern are opposed in parallel to each other and are inclined with respect to the X axis. As a result, not only a sufficient light intensity is obtained but also the contrast of an optical image is improved, thereby making it possible to attain both improvement of resolution and expansion of the process margin.

DETAILED DESCRIPTION OF THE PREFERRED EMBODIMENTS

First Embodiment

A description will be given below about a halftone phase shifting mask and a method for manufacturing the same. First, a manufacturing process will be described.

Figure 1:
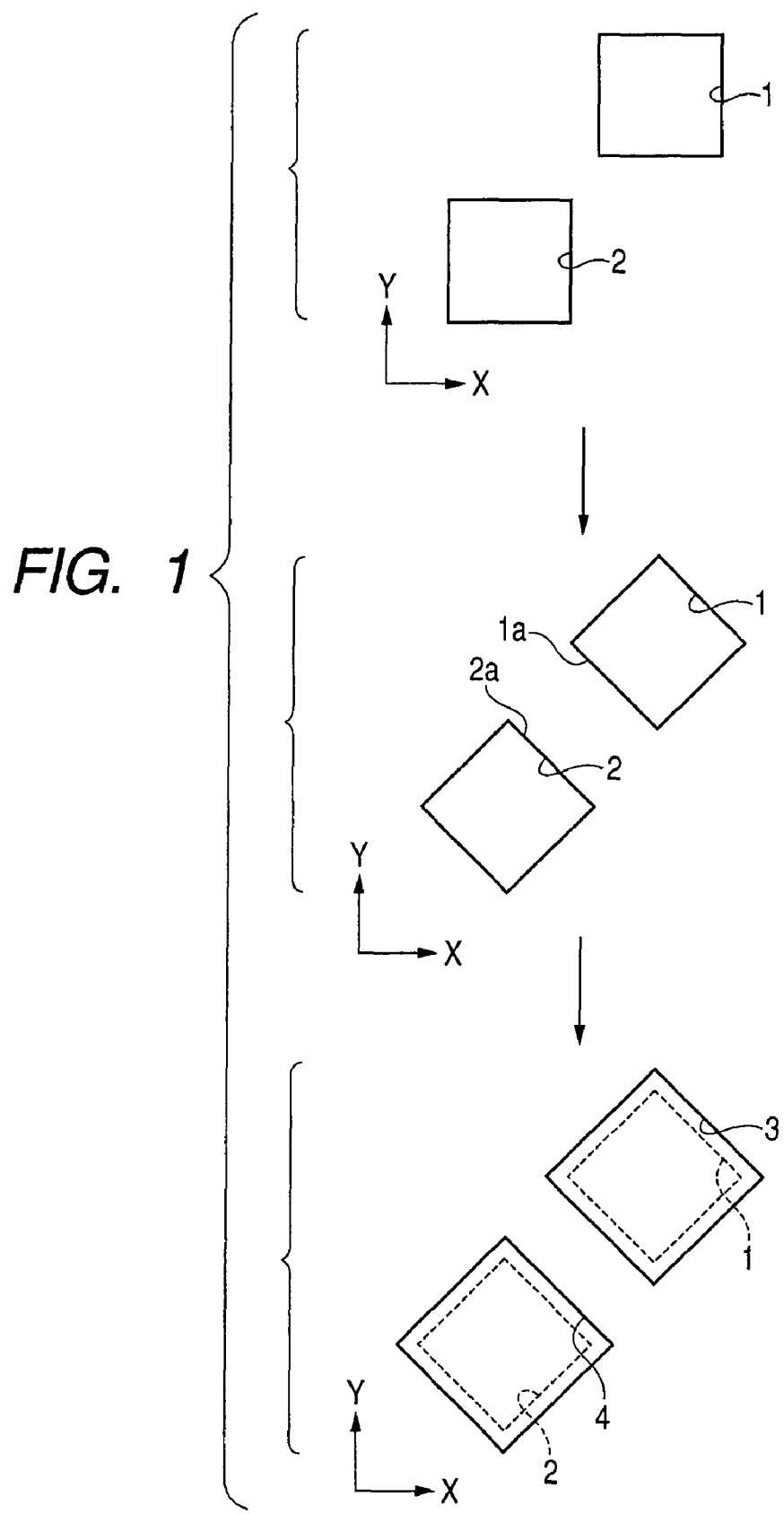
FIG. 1 is a plan view showing schematically a series of processings for rectangular aperture patterns in manufacturing a halftone phase shifting mask according to a first embodiment of the present invention.

As shown at an upper stage of FIG. 1, as design patterns, out of rectangular aperture patterns having pattern edges parallel to an X axis and pattern edges parallel to a Y axis orthogonal to the X axis, there are extracted two adjacent rectangular aperture patterns 1 and 2 which are disposed obliquely with respect to the X axis (step 1). By the "disposed obliquely" is meant that a line segment joining the centers of the two rectangular aperture patterns is inclined with respect to the X axis.

Next, as shown at a middle stage of FIG. 1, the thus-extracted two rectangular aperture patterns 1 and 2 are each rotated at a certain angle so that a pattern edge 1a corresponding to one side of one rectangular aperture pattern 1 and a pattern edge 2a corresponding to one side of the other rectangular aperture pattern 2 are opposed in parallel to each other (step 2).

Then, as shown at a lower stage of FIG. 1, the two rectangular aperture patterns 1 and 2 each rotated at a certain angle are subjected to optical proximity correction. In this way there are formed two corrected rectangular aperture patterns 3 and 4 having been subjected to optical proximity effect correction (step 3). Thereafter, a mask is fabricated using mask pattern data prepared on the basis of data on the corrected rectangular aperture patterns 3 and 4, whereby there is formed a halftone phase shifting mask (not shown) including aperture patterns (step 4).

Figure 2:
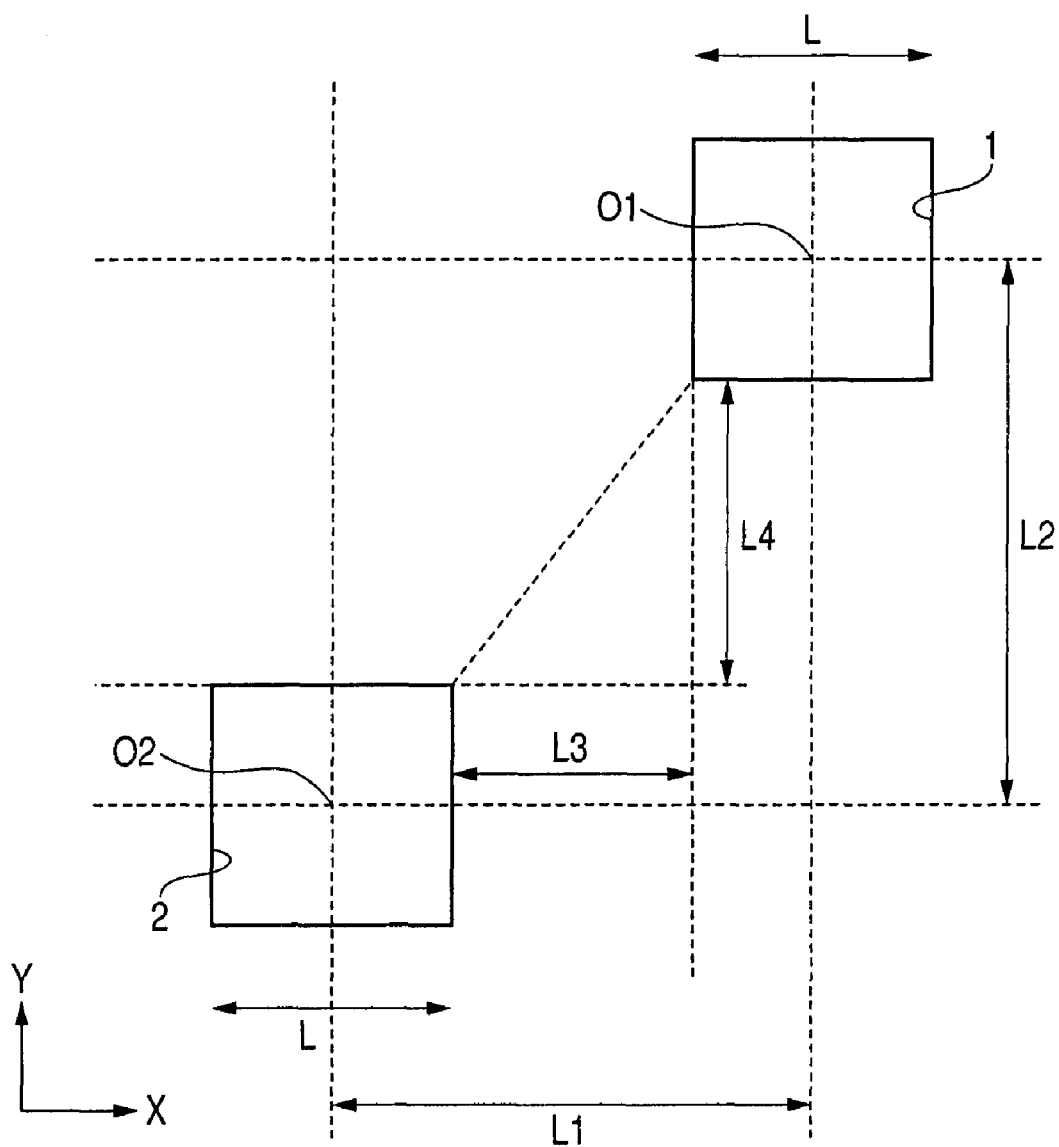
FIG. 2 is a plan view showing one step in the rectangular aperture pattern processing for explaining the halftone phase shifting mask manufacturing method in more detail.

Next, in connection with these series of steps, a more detailed description will be given while giving dimensional examples. The two rectangular aperture patterns 1 and 2 extracted in step 1 are shown in FIG. 2. In each of the two rectangular aperture patterns 1 and 2, the length L of one side is assumed to be 45 nm. The distances L1 and L2 in X- and Y-axis directions respectively between a center O1 of the rectangular aperture pattern 1 and a center O2 of the rectangular aperture pattern 2 are assumed to be 90 nm and 100 nm, respectively.

Figure 3:
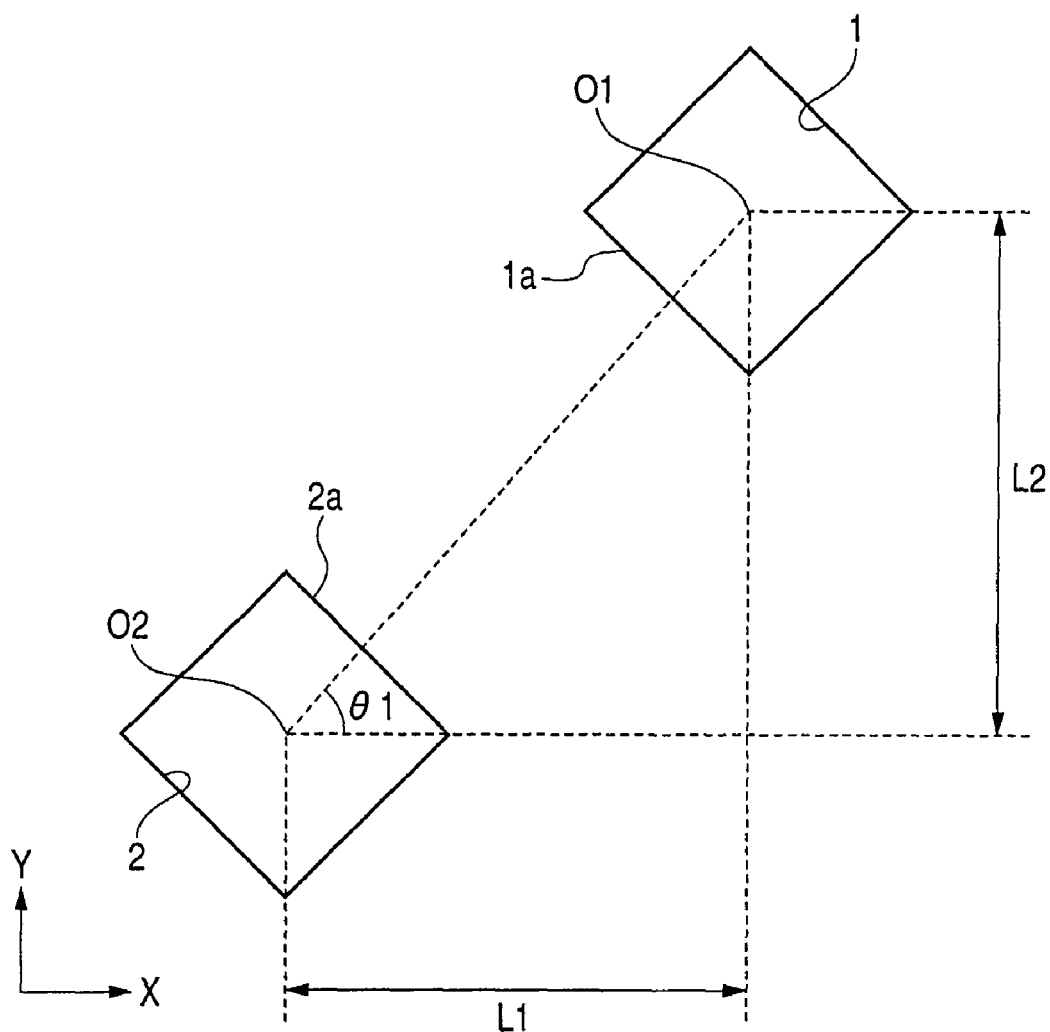
FIG. 3 is a plan view showing a step which follows the step of FIG. 2 in the first embodiment.

The two rectangular aperture patterns 1 and 2 which were each obtained by rotation at a certain angle in step 2 are shown in FIG. 3. The angle between the line segment joining the centers O1 and O2 of the rectangular aperture patterns 1, 2 and the X axis is about 48°. Therefore, the pattern edges 1a and 2a of the rectangular aperture patterns 1 and 2 can be spaced apart the longest distance and opposed in parallel to each other by rotating the two rectangular aperture patterns about 48° from the state shown in FIG. 2.

Figure 4:
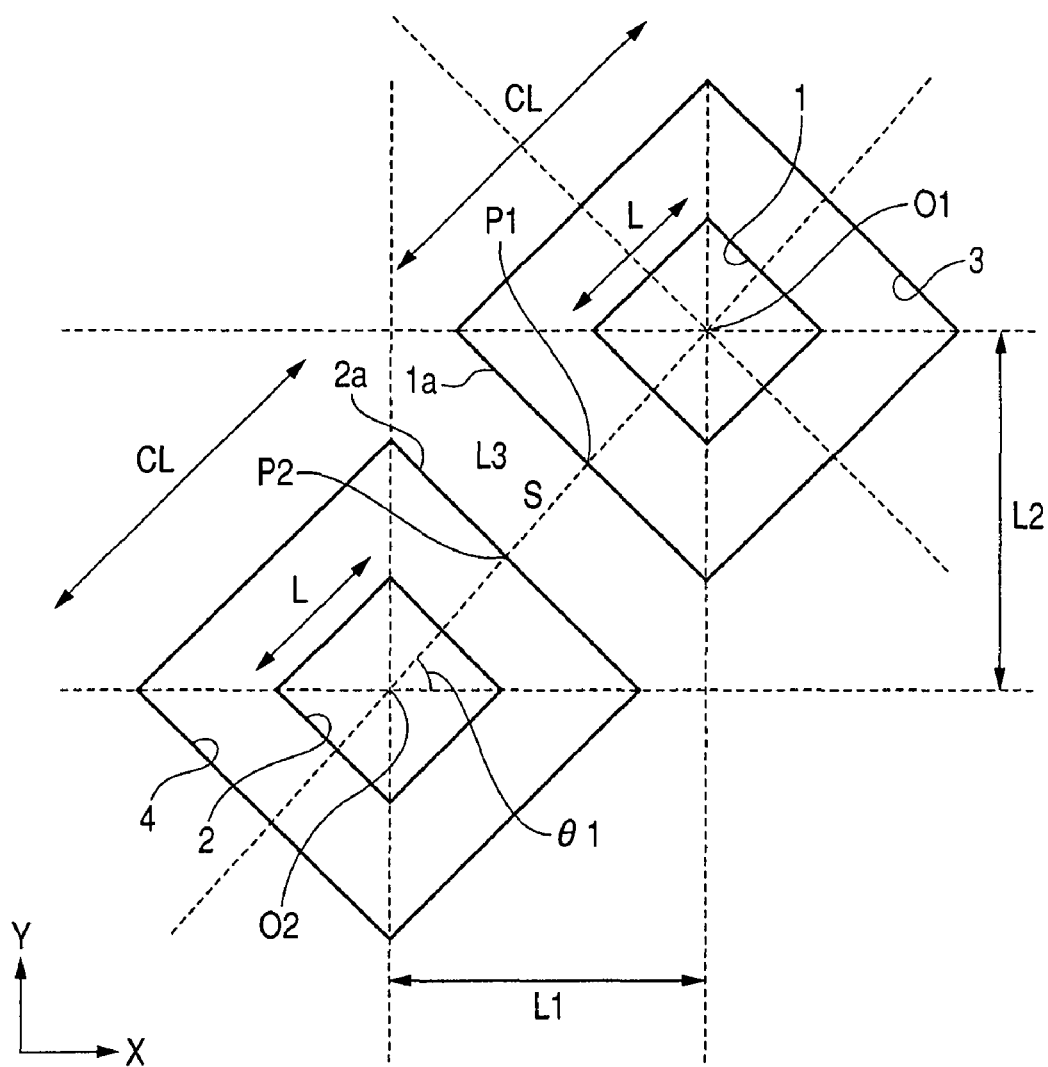
FIG. 4 is a plan view showing a step which follows the step of FIG. 3 in the first embodiment.

The two corrected rectangular aperture patterns 3 and 4 which were subjected to optical proximity effect correction in step 3 are shown in FIG. 4. The length L3 of the line segment O1O2 joining the centers O1 and O2 of the rectangular aperture patterns 1 and 2 is 134.5 nm. If the minimum size S (P1P2) which permits processing as a mask is assumed to be 30 nm, then as to the rectangular aperture patterns 1 and 2 having a one-side length L of 45 nm, it becomes possible to make expansion up to the corrected rectangular aperture patterns 3 and 4 having a one-side length CL of 104.5 nm.

Figure 5:
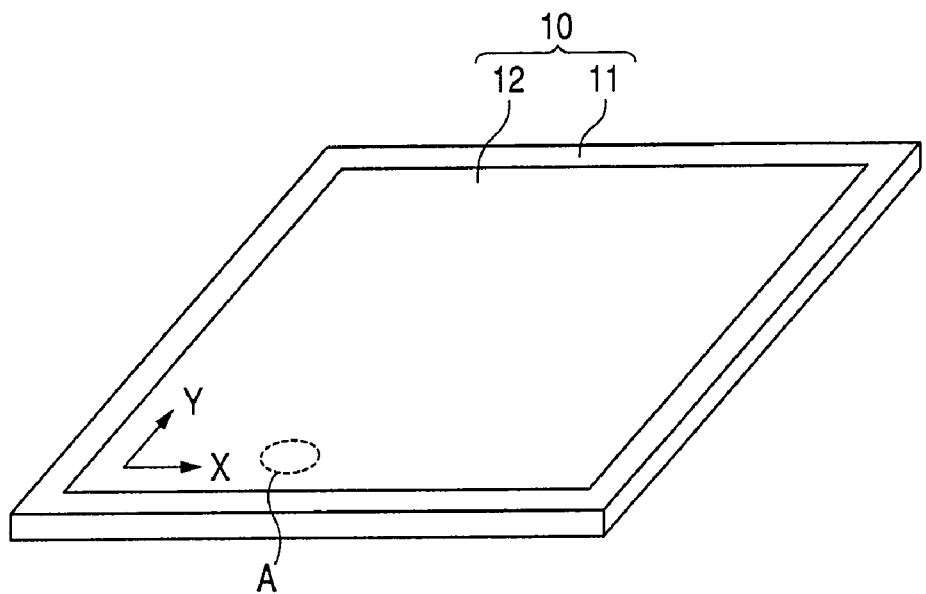
FIG. 5 is a perspective view showing a step which follows the step of FIG. 4 in the first embodiment.
Figure 6:
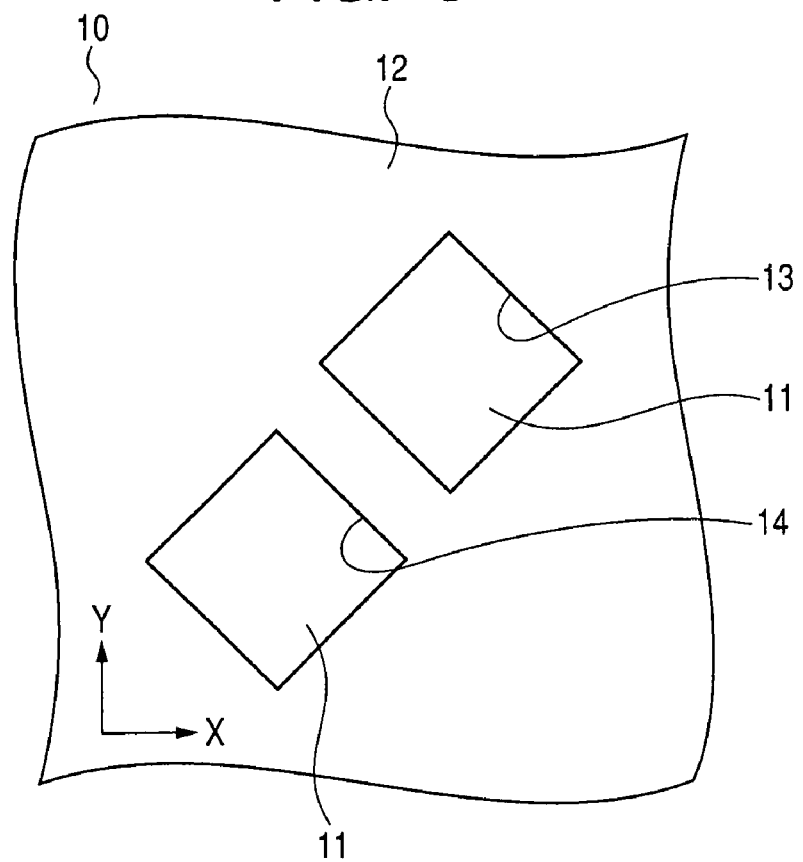
FIG. 6 is a partial enlarged plan view of a portion A shown in FIG. 5 in the first embodiment.

The halftone phase shifting mask which was fabricated on the basis of data on the corrected rectangular aperture patterns 3 and 4 in step 4 is shown in FIGS. 5 and 6. In the halftone phase shifting mask 10, as shown in FIG. 5, a molybdenum silicide film 12 is formed as a halftone phase shifting film on a surface of a quarts glass substrate 11. As shown in FIG. 6, on the basis of the data on the corrected rectangular aperture patterns 3 and 4, electron beam exposure is performed on a resist film formed on the molybdenum silicide film 12.

Next, the molybdenum silicide film 12 is processed using a resist pattern formed by a certain development treatment to form a rectangular aperture pattern 13 corresponding to the corrected rectangular aperture pattern 3 and a rectangular aperture pattern 14 corresponding to the corrected rectangular aperture pattern 4. In this state the surface of the quarts glass substrate 11 is exposed. In this way there is fabricated the halftone phase shifting mask 10 formed with certain patterns including the rectangular aperture patterns 13 and 14.

In the mask fabrication described above, optical proximity effect correction is performed in a certain angle-rotated state of each of the two adjacent rectangular aperture patterns 1 and 2, whereby the aperture pattern size can be made larger than in case of performing the optical proximity effect correction without such rotation.

Figure 7:
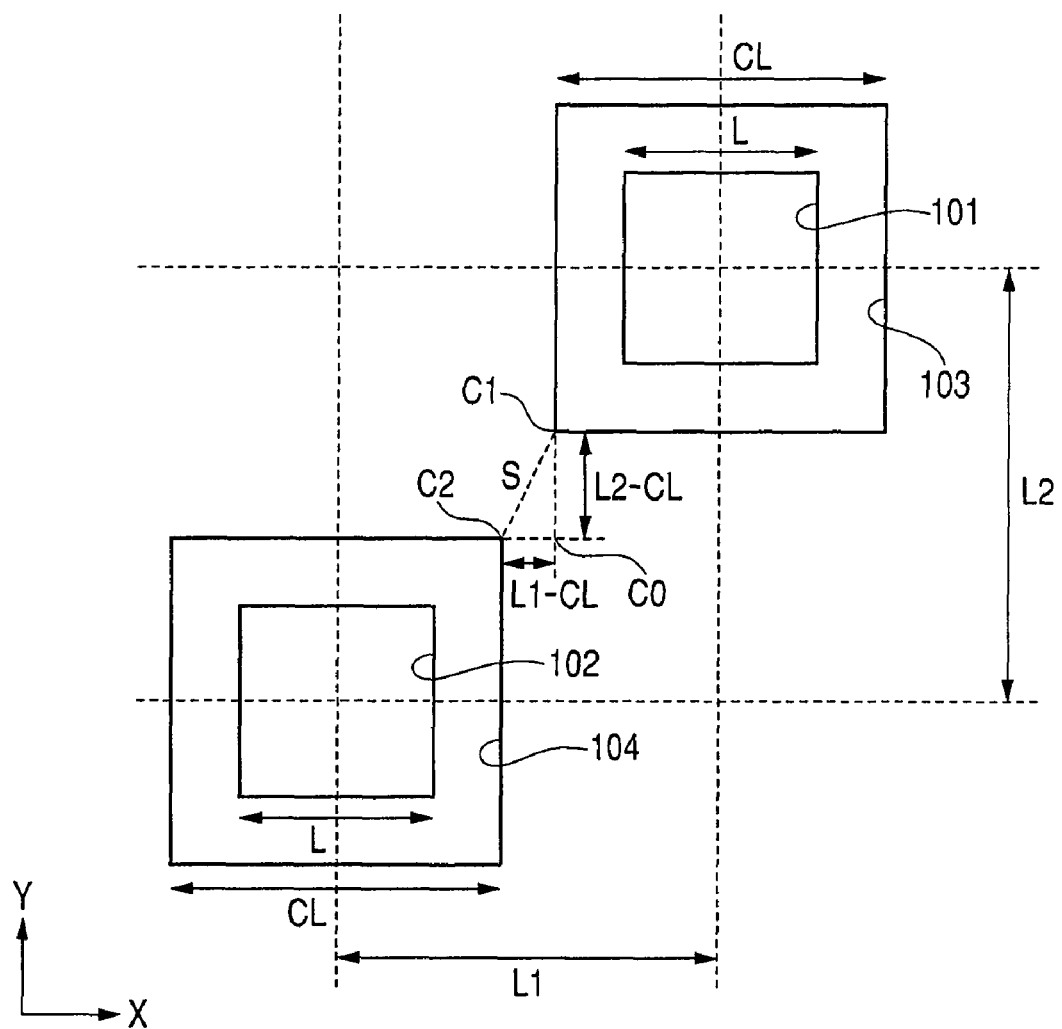
FIG. 7 is a plan view showing one step in a rectangular aperture pattern processing in manufacturing a halftone phase shifting mask according to a comparative example.

As shown in FIG. 7, when the adjacent rectangular aperture patterns 1 and 2 disposed obliquely relative to the X axis are to be expanded (subjected to optical proximity effect correction) without rotation, a corner C1 of the aperture pattern 1 and a corner C2 of the aperture pattern 2 approach each other. Thus, the aperture patterns 1 and 2 can be expanded until the spacing between the corners C1 and C2 becomes a minimum size S which permits processing as a mask.

If attention is paid to the triangle C0C1C2 and the minimum size S is assumed to be 30 nm, then from the relation of three-side lengths in the triangle C0C1C2, rectangular aperture patterns 101 and 102 each having a one-side length L of 45 nm can be expanded to corrected rectangular aperture patterns 103 and 104 each having a one-side length CL of 74.4 nm.

Consequently, in the case where the two adjacent rectangular aperture patterns 1 and 2 each having a one-side length L of 45 nm are subjected to optical proximity effect correction without rotation thereof, they can be expanded only up to the corrected rectangular aperture patterns 103 and 104 (case A) each having a one-side length CL of 74.4 nm. On the other hand, in case of performing the optical proximity effect correction in the certain angle-rotated state of each of the aperture patterns, it is possible to make expansion up to the corrected rectangular aperture patterns 3 and 4 (case B) each having a one-side length CL of 104.5 nm. That is, a possible range of master pattern correction made by optical proximity effect correction can be expanded.

Thus, in the case where photolithography process is performed using a halftone phase shifting mask based on case B, there is obtained a more sufficient light intensity and the two adjacent aperture patterns can be transferred to a photoresist in a state of satisfactory resolution, in comparison with the case where photolithography process is performed using a halftone phase shifting mask based on case A. Moreover, when making optical proximity effect correction, the aperture pattern expanding range becomes wider and hence it is also possible to enhance the freedom of data processing.

In an actual mask pattern there exist a relatively dense pattern region and a relatively sparse pattern region. Accordingly, there occurs a difference in the intensity of light, depending on the degree of whether aperture patterns are dense or sparse. This also depends on exposure conditions. For example, if exposure conditions are set to conditions in which dense aperture patterns are resolved, then in a sparse pattern region, a projected optical image profile may be deteriorated, resulting in aperture patterns becoming difficult to be transferred.

As a method for improving the quality of a projected optical image in a thin region of aperture patterns there is known a method in which fine aperture patterns not to be resolved for a photoresist are provided around aperture patterns to be resolved. Such fine aperture patterns are called non-resolvable dummy patterns or SRAF (Sub-Resolution Assist Feature).

In a series of mask fabricating steps described above, the aforesaid non-resolvable dummy patterns are formed (disposed), for example, after rotation of rectangular aperture patterns and before making optical proximity correction. This manufacturing process will now be described in a little more detail. First, as shown at an upper stage of FIG. 8, as design patterns, out of rectangular aperture patterns having pattern edges parallel to an X axis and pattern edges parallel to a Y axis in an XY plane defined by the X and Y axes, there are extracted two aperture patterns 1 and 2 which are adjacent each other while being disposed obliquely with respect to the X axis (step 1).

Figure 8:
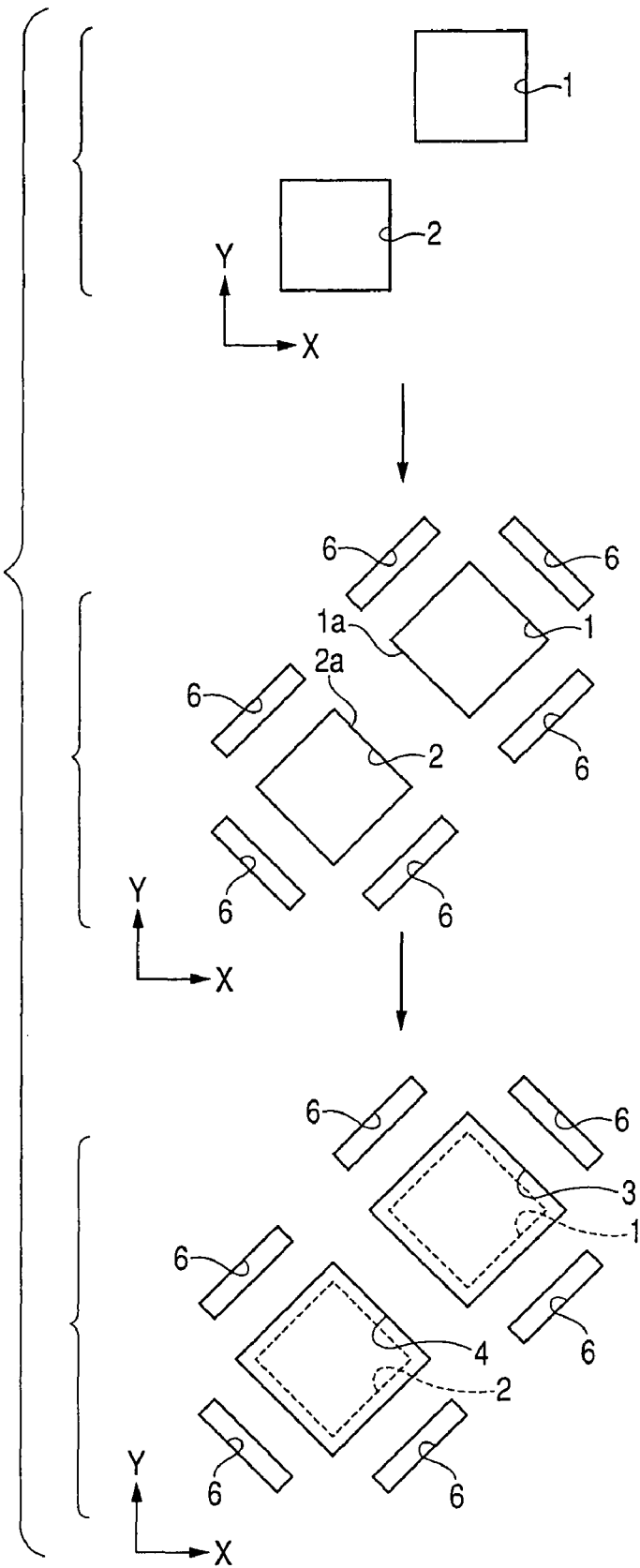
FIG. 8 is a plan view showing schematically a series of processing incase of forming non-resolvable dummy patterns as a rectangular aperture pattern processing in the first embodiment.

Next, as shown at a middle stage of FIG. 8, the thus-extracted two rectangular aperture patterns 1 and 2 are each rotated at a certain angle in such a manner that a pattern edge 1a corresponding to one side of one rectangular aperture pattern 1 and a pattern edge 2a corresponding to one side of the other rectangular aperture pattern 2 are opposed in parallel to each other (step 2). Then, non-resolvable dummy patterns 6 are formed (disposed) around the thus-rotated aperture patterns 1 and 2 so as to confront pattern edges of the aperture patterns 1 and 2 (step 3).

Next, as shown at a lower stage of FIG. 8, the two rectangular aperture patterns 1 and 2 having been rotated at a certain angle are subjected to optical proximity effect correction. In this way there are formed two rectangular, optical proximity effect corrected aperture patterns 3 and 4 (step 4). Thereafter, on the basis of data on the corrected rectangular aperture patterns 3 and 4, electron beam exposure is performed on resist film stacked onto a molybdenum silicide film. Then, using a resist mask pattern which has been formed by a certain development treatment, the molybdenum silicide film is processed to form a halftone phase shifting mask (not shown) including aperture patterns (step 5).

In the above halftone phase shifting mask, since the non-resolvable dummy patterns 6 are disposed, even in a sparse pattern region there is obtained a light intensity equal to that in a dense pattern region, thus making it possible to transfer aperture patterns positively to a photoresist.

As another example, in the foregoing series of mask fabricating steps, non-resolvable dummy patterns may be disposed before rotation of aperture patterns. The manufacturing step concerned will be described below in a little more detail.

Figure 9:
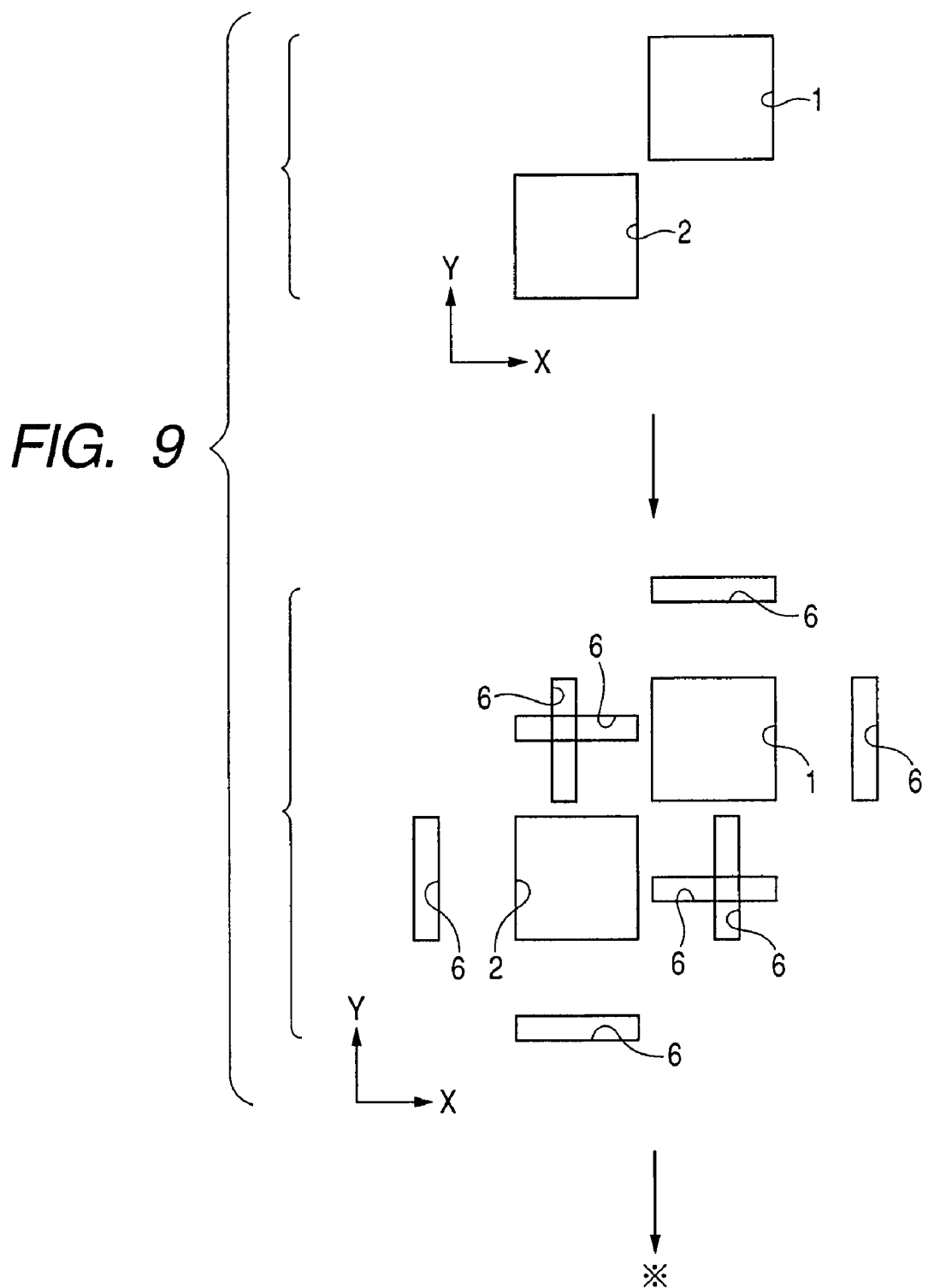
FIG. 9 is a first plan view showing schematically a processing in case of forming other non-resolvable dummy patterns as a rectangular aperture pattern processing in the first embodiment.

First, as shown at an upper stage of FIG. 9, as design patterns, out of rectangular aperture patterns having pattern edges parallel to an X axis and pattern edges parallel to a Y axis in an XY plane defined by the X and Y axes, there are extracted two rectangular aperture patterns 1 and 2 which are adjacent each other obliquely with respect to the X axis (step 1). Then, as shown at a lower stage of FIG. 9, non-resolvable dummy patterns 6 are disposed temporarily around the aperture patterns 1 and 2 so as to confront pattern edges of the aperture patterns 1 and 2 (step 2).

Figure 10:
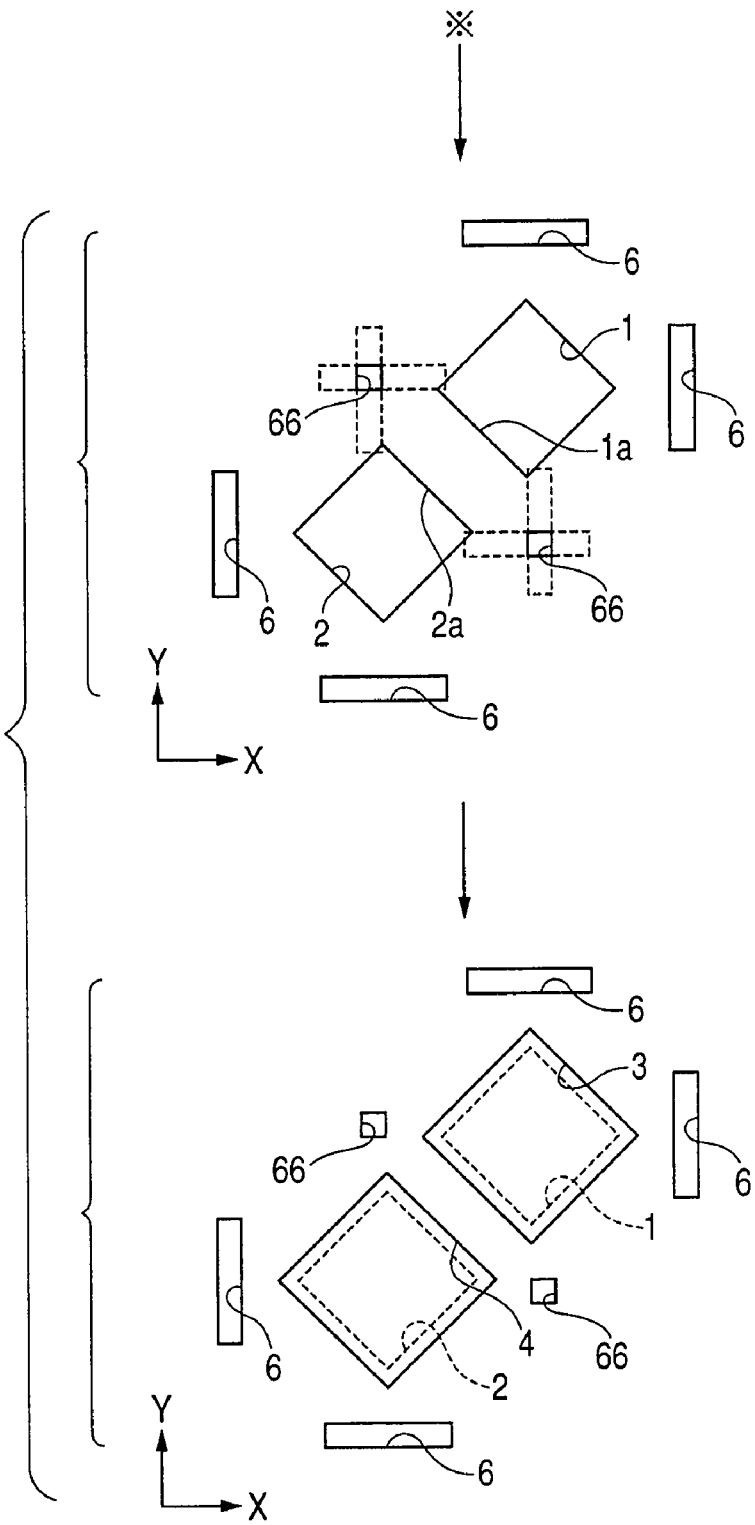
FIG. 10 is a second plan view showing schematically a processing which follows the processing of FIG. 9 in case of forming other non-resolvable dummy patterns as a rectangular aperture pattern processing in the first embodiment.

Next, as shown at an upper stage of FIG. 10, the thus-extracted two rectangular aperture patterns 1 and 2 are each rotated at a certain angle in such a manner that a pattern edge corresponding to one side of one rectangular aperture pattern 1 and a pattern edge 2a corresponding to one side of the other rectangular aperture pattern 2 are opposed in parallel to each other. At the same time, non-resolvable dummy patterns 66 are re-disposed by a graphic processing lest the aperture patterns 1, 2 and the non-resolvable dummy patterns 6 should interfere or overlap each other (step 3).

Then, as shown at a lower stage of FIG. 10, the two rectangular aperture patterns 1 and 2 having been rotated at a certain angle are subjected to optical proximity effect correction. In this way there are fabricated two optical proximity effect corrected rectangular aperture patterns 3 and 4 (step 4). Thereafter, on the basis of data on the corrected rectangular aperture patterns 3 and 4, an electron beam exposure is performed on resist film stacked on a molybdenum silicide film. Subsequently, the molybdenum silicide film is processed using as a mask a resist pattern formed by a certain development processing, whereby there is formed a halftone phase shift mask (not shown) including aperture patterns (step 5).

In the above halftone phase shifting mask, since the non-resolvable dummy patterns 6 and 66 are disposed, even in a sparse pattern region, there is obtained a light intensity equal to that in a dense region of aperture patterns and it is possible to transfer aperture patterns positively to a photoresist.

Modification

In connection with the above mask fabricating process, reference has been made as an example to the case where two rectangular aperture patters 1 and 2 are each rotated at a certain angle so that pattern edges 1a and 2a of the aperture patterns 1 and 2 respectively are opposed in parallel to each other. However, two rectangular aperture patterns may be rotated at a preset angle.

Figure 11:
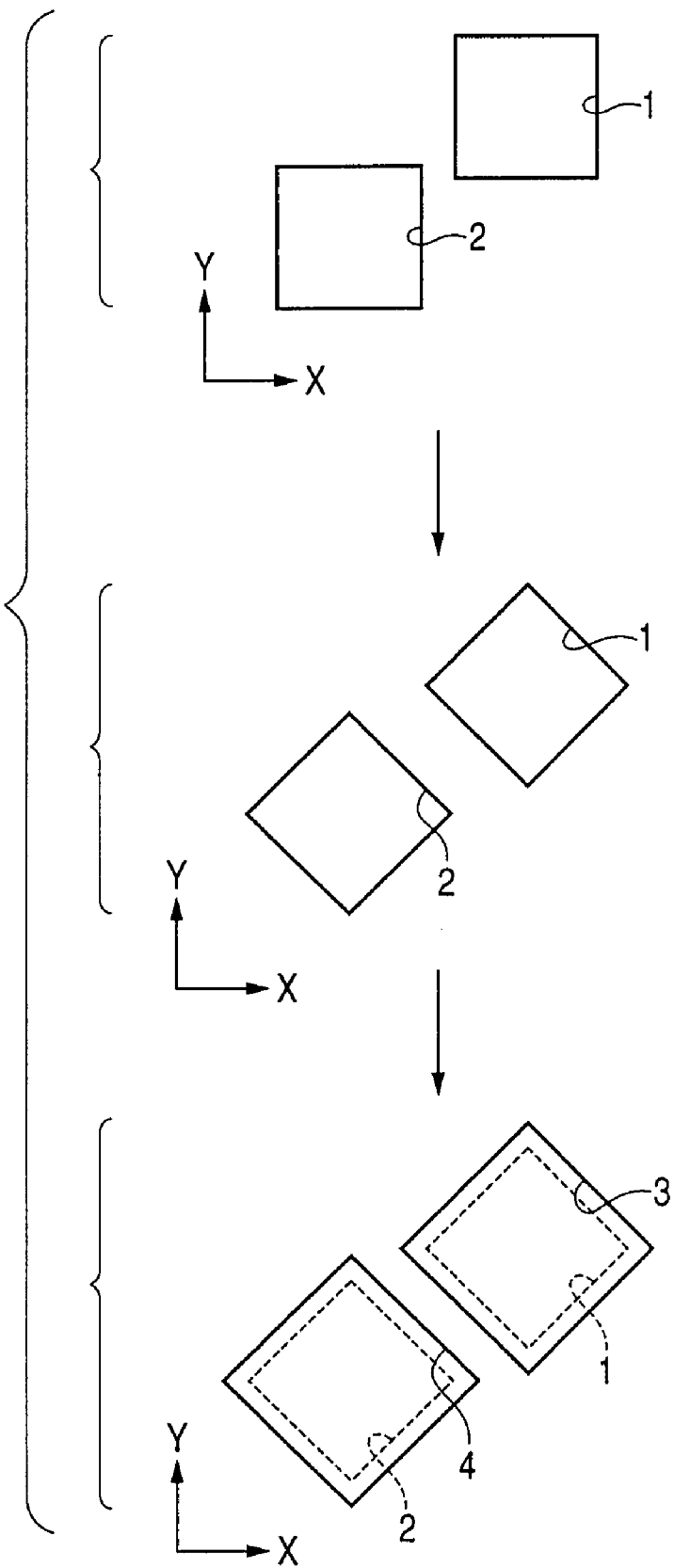
FIG. 11 is a plan view showing schematically another series of processings for rectangular aperture patterns in manufacturing a halftone phase shifting mask according to a modification of the first embodiment.

In this case, after extracting two rectangular aperture patterns 1 and 2 which are adjacent each other obliquely with respect to the X axis, as shown at an upper stage of FIG. 11, the two rectangular aperture patterns 1 and 2 are each rotated at a preset angle, as shown at a middle stage of the same figure. Thereafter, the thus-rotated two rectangular aperture patterns 1 and 2 are each subjected to optical proximity effect correction, as shown at a lower stage of the same figure.

Figure 12:
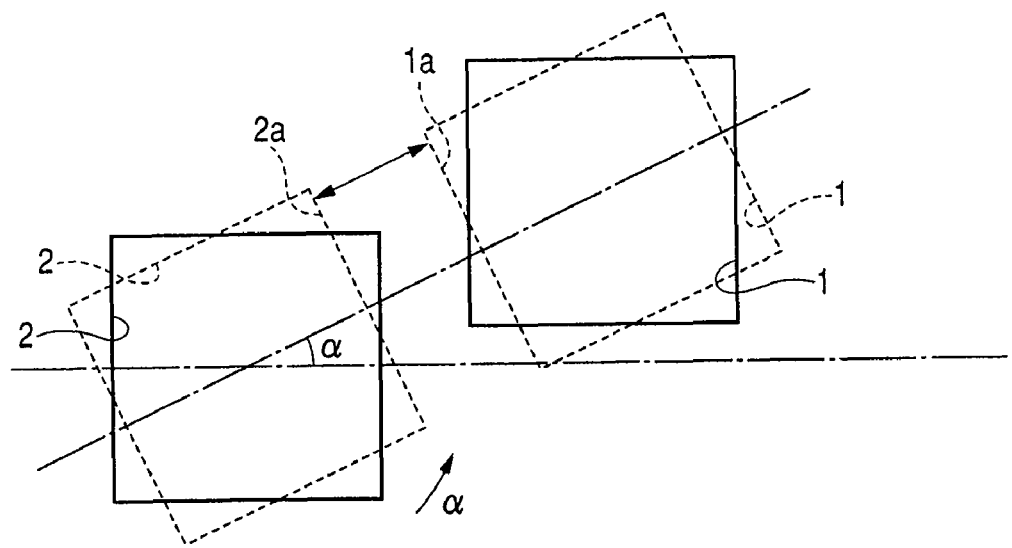
FIG. 12 is a plan view showing an example of the processing of FIG. 11 in the first embodiment.
Figure 13:
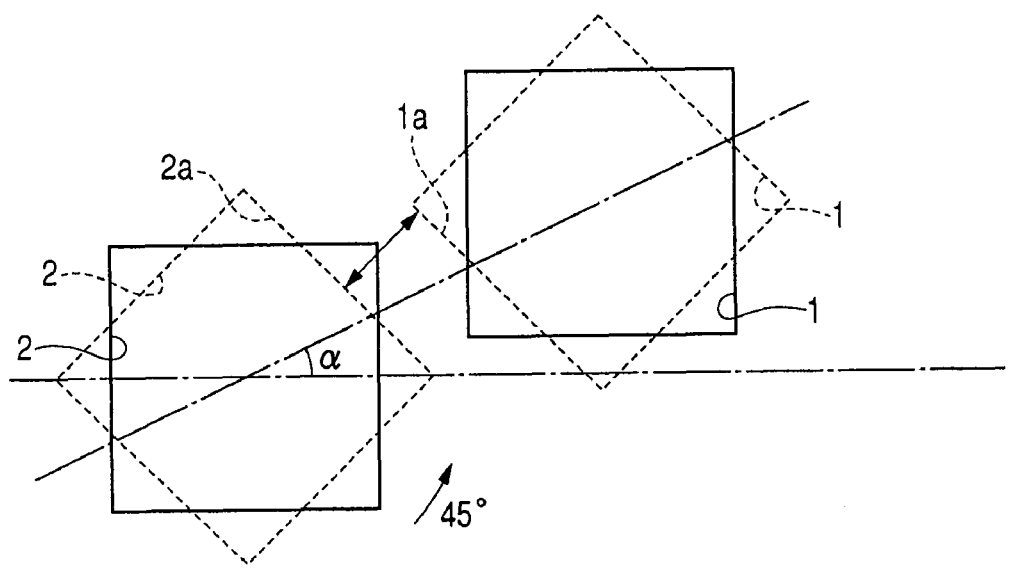
FIG. 13 is a plan view showing another example of the processing of FIG. 11 in the first embodiment.

It is preferable that the preset angle be determined on the basis of an angle between a line segment joining the centers of two rectangular aperture patterns and the X axis. For example, as shown in FIG. 12, given that the angle (inclination angle) between a line segment joining the centers of aperture patterns 1, 2 and the X axis is a, the angle of rotation of the aperture patterns 1 and 2 may be set at the angle a. Alternatively, as shown in FIG. 13, even if the inclination angle is a, the angle in question may be set at, say, 45°, taking the inclination angle distribution throughout the patterns into account, that is, taking into account the fact that in master pattern figures in general, oblique pattern edge angles allowed other than 0° and 90° pattern edge angles have so far been only 45° and 135°.

Figure 14:
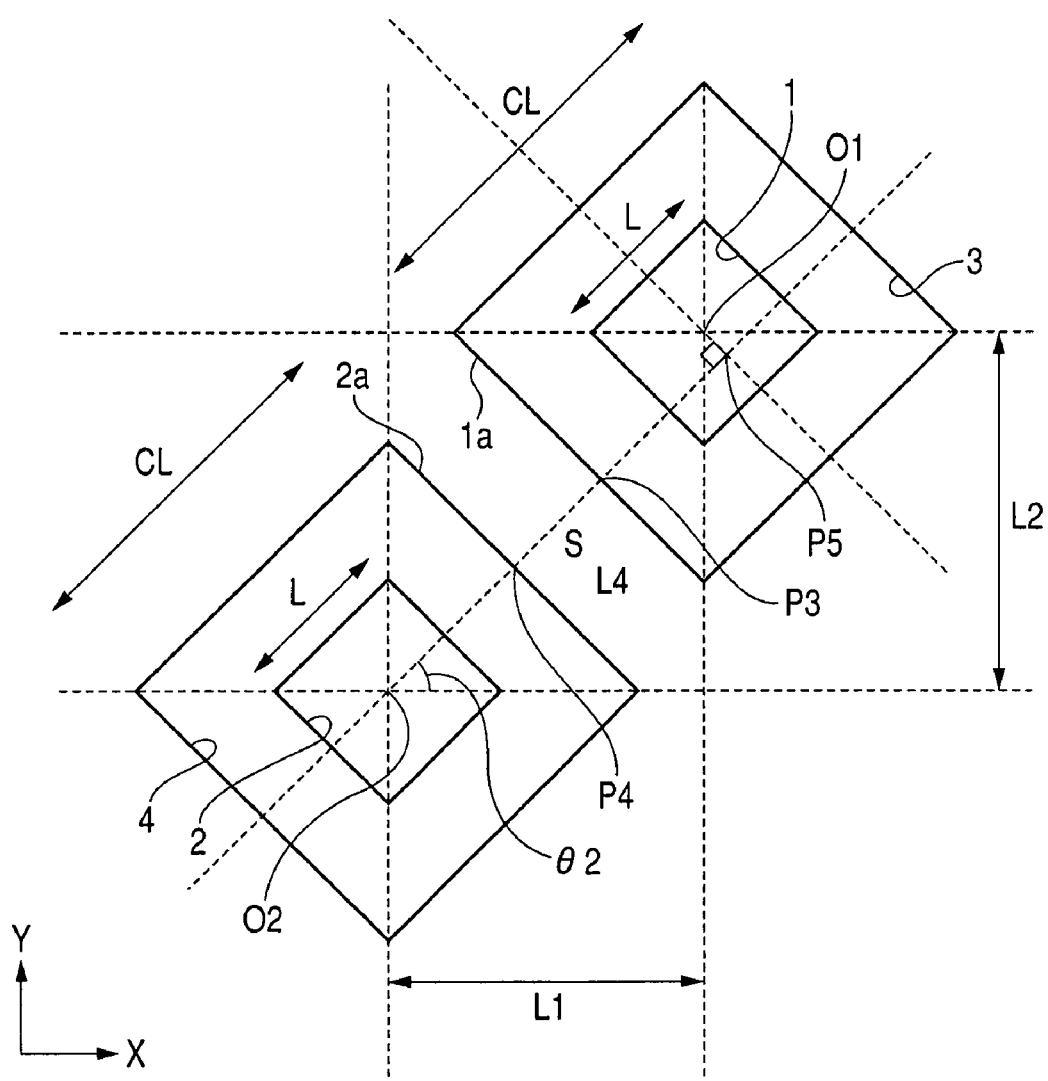
FIG. 14 is a plan view showing another example of processing for the rectangular aperture patterns of FIG. 1 in the first embodiment.

In the foregoing manufacturing process shown in FIG. 1 the angle between a line segment joining the centers of the aperture patterns 1, 2 and the X axis was set at $\theta1(=48°)$, but it may be set at, say, 45°. In this case, as shown in FIG. 14, the length L4 between O2 and P5 is 134.4 nm, and if a minimum processable size S (P3P4) as a mask is assumed to be 30 nm, the rectangular aperture patterns 1 and 2 having a one-side length L of 45 nm can be expanded up to corrected rectangular aperture patterns 3 and 4 respectively having a one-side length CL of 104.4 nm.

Thus, also when the aperture patterns 1 and 2 are each rotated at a preset angle, the pattern edge 1a of the aperture pattern 1 and the pattern edge 2a of the aperture pattern 2 become opposed in parallel to each other, and at the time of performing optical proximity effect correction the size of each of the rectangular aperture patterns 1 and 2 can be set larger in comparison with the case where the aperture patterns are not rotated. Besides, by determining the rotational angle beforehand, it becomes easier to handle pattern data and it is possible to shorten the data processing time.

Evaluation by Simulation

Figure 15:
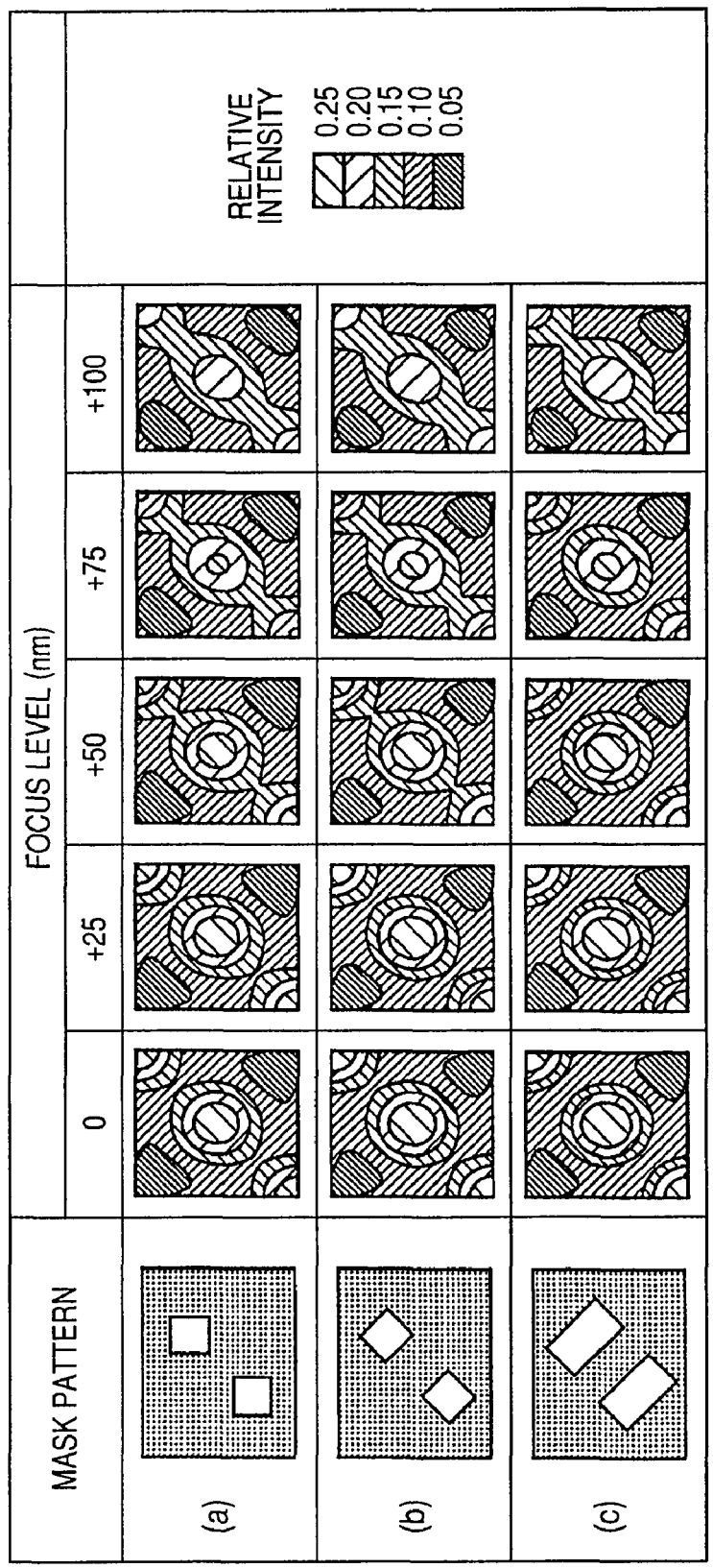
FIG. 15 is a diagram showing simulation results of projected optical images on substrates using halftone phase shift masks in the first embodiment.

The present inventor evaluated optical images formed on a semiconductor substrate in terms of simulation using mask patterns including the above aperture patterns, the results of which are shown in FIG. 15. First, three mask patterns (a) to (c) were used for evaluation. In FIG. 15, for the simplification of explanation, only main master patterns are shown and non-resolvable dummy patterns disposed around each main mask pattern on a mask are not shown. The mask pattern (a) comprises rectangular aperture patterns having pattern edges parallel to an X axis and pattern edges parallel to a Y axis, which aperture patterns are two rectangular aperture patterns adjacent each other obliquely with respect to the X axis.

The mask pattern (b) has two rectangular aperture patterns, in which the distance between the two rectangular aperture patterns is set equal to the distance between two aperture patterns in the master pattern (a), and the two rectangular aperture patterns are each rotated at a certain angle so that a pattern edge of one rectangular aperture pattern and a pattern edge of the other rectangular aperture pattern are opposed in parallel to each other.

In the mask pattern (c), out of the pattern edges of the two rectangular aperture patterns in the mask pattern (b), those extending in a direction orthogonal to a line segment joining the centers of the aperture patterns are made longer. The size of the mask pattern was adjusted so that the dimensions in the X direction upon slicing optical images on a semiconductor substrate at a certain strength position became equal.

With a focus level of 0 nm (in-focus), a maximum value of light intensity near the center of each aperture pattern is higher in the mask pattern (b) than in the mask pattern (a), and the light intensity of the mask pattern (c) is the highest. It turned out that even if one distance between two rectangular aperture patterns and the other distance between two such aperture patterns were the same, the aperture patterns each having been rotated at a certain angle to let respective pattern edges (sides) confront each other afforded a higher light intensity.

In a defocus condition, a difference in maximum light intensity value was recognized among the mask patterns (a) to (c). The light intensity in the region between one aperture pattern and the other was found to be lower in the mask pattern (b) than in the mask pattern (a) and the light intensity of the mask pattern (c) proved to be the lowest.

Figure 16:
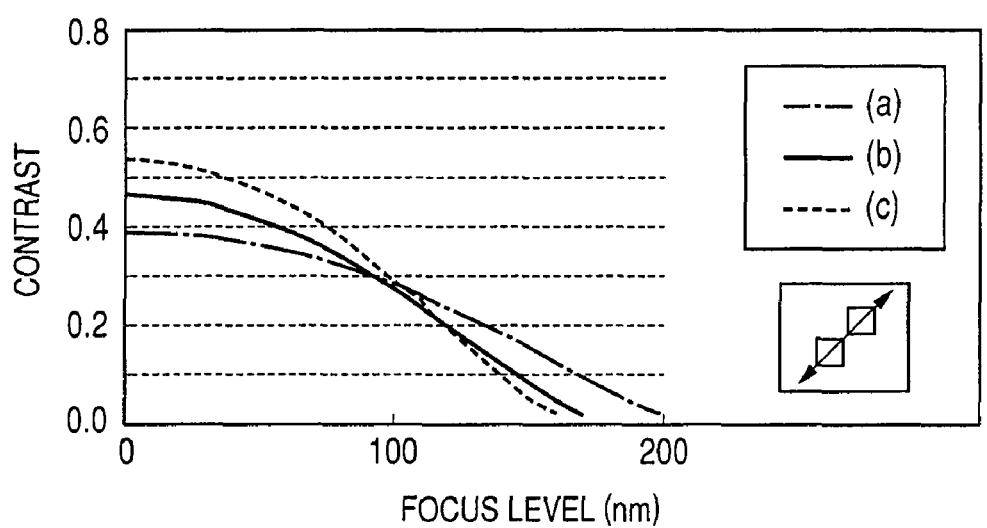
FIG. 16 is a diagram showing simulation results of contracts of projected optical images on substrates using halftone phase shifting masks in the first embodiment.

Referring now to FIG. 16, there is shown a graph of optical image contrasts which have been calculated on the basis of the aforesaid focus level. A look at FIG. 16 shows that in an in-focus condition the optical image contrast is higher in the mask pattern (b) than in the mask pattern (a) and that the mask pattern (c) is the highest. From this result it is seen that the rectangular aperture patterns having been rotated at a certain angle to let respective pattern edges (sides) confront each other afford a higher resolution.

Assuming that an aperture pattern can be resolved at a contrast value of 0.4 or more, it is seen that in the mask pattern (a) it is impossible to resolve aperture patterns even in an in-focus condition, while in the mask patterns (b) and (c) it is possible to resolve aperture patterns.

Thus, by rotating rectangular aperture patterns at a certain angle to let respective pattern edges (sides) confront each other it is not only possible to make the aperture pattern size larger but also possible to improve the optical image contrast and attain both improvement of resolution and enlargement of process margin.

Second Embodiment

Figure 17:
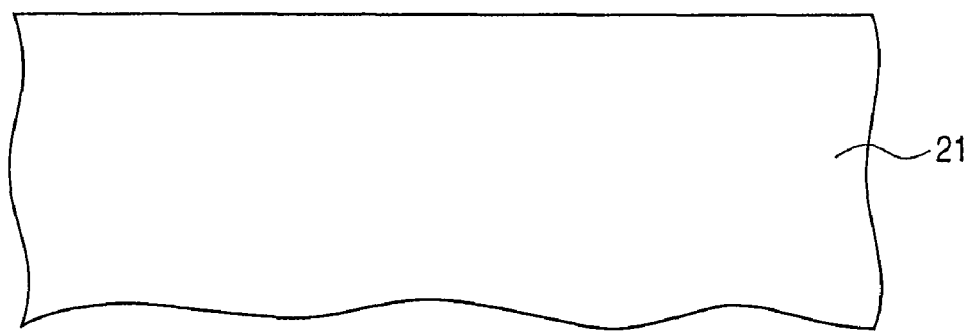
FIG. 17 is a sectional view showing one step in a semiconductor device manufacturing method according to a second embodiment of the present invention.
Figure 18:
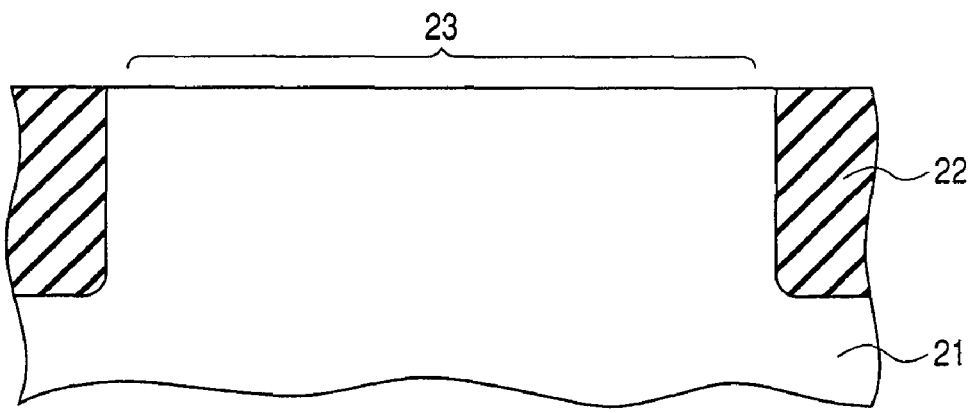
FIG. 18 is a sectional view showing a step which follows the step of FIG. 17 in the second embodiment.

In this second embodiment reference will be made to a method for manufacturing a semiconductor device provided with a MOS transistor as an example of the above semiconductor device manufacturing method using a halftone phase shifting mask. First, as shown in FIG. 17, a semiconductor substrate 21 having a main surface is provided, then, as shown in FIG. 18, a trench separation insulating film 22 is formed in a certain region of the semiconductor substrate 21, whereby there is formed a device-forming region 23.

Figure 19:
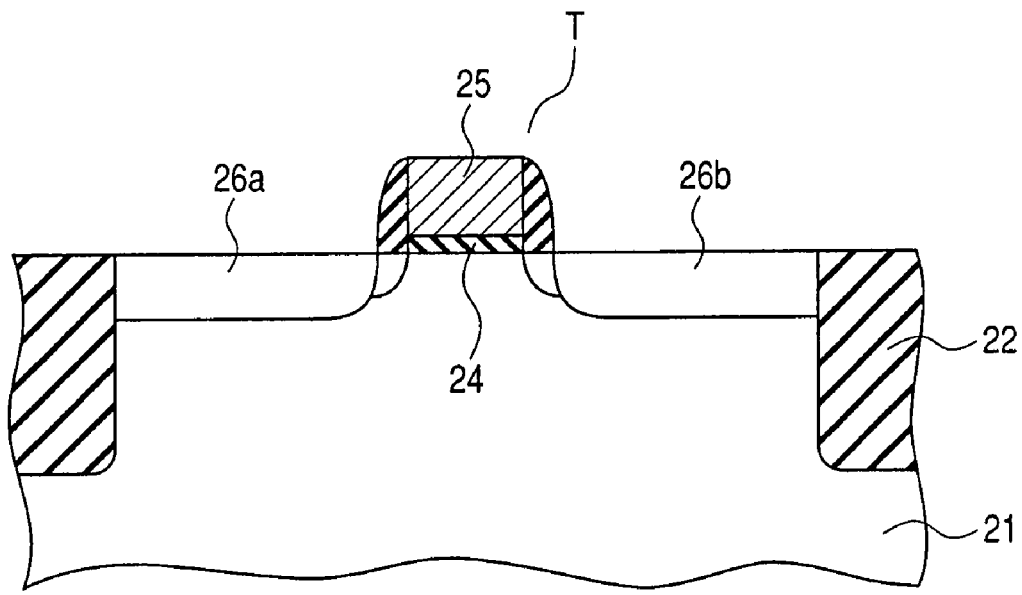
FIG. 19 is a sectional view showing a step which follows the step of FIG. 18 in the second embodiment.
Figure 20:
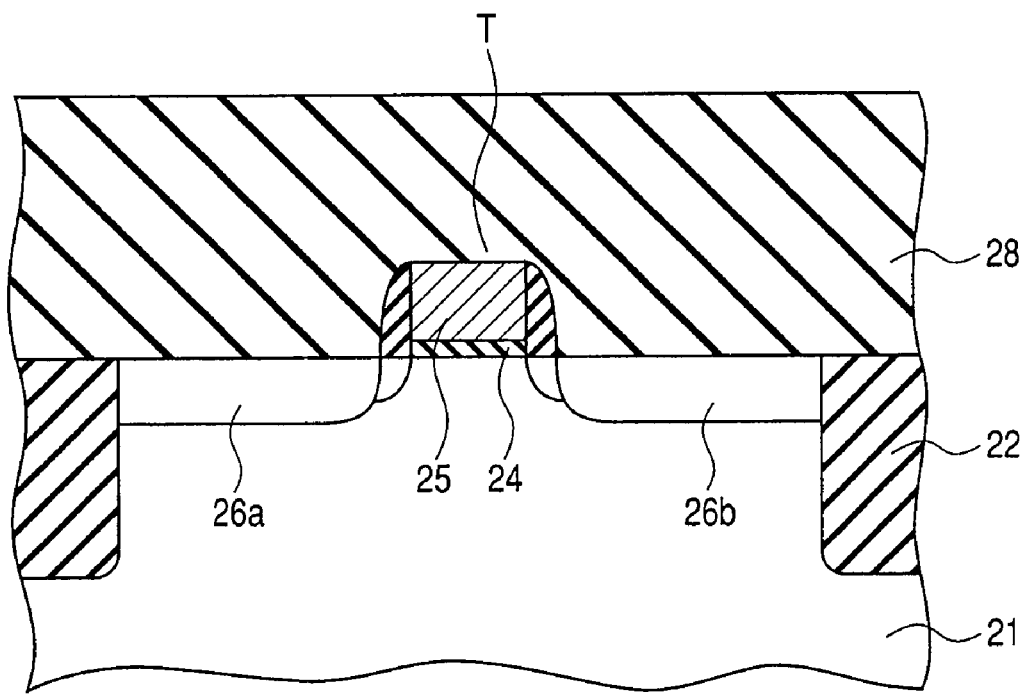
FIG. 20 is a sectional view showing a step which follows the step of FIG. 19 in the second embodiment.

Next, as shown in FIG. 19, a gate electrode 25 is formed through a gate insulating film 24 on a region of the semiconductor substrate 21 positioned in the device-forming region. Thereafter, a certain conductive type impurity ion is implanted into certain regions to form a pair of source and drain regions 26a, 26b. In this way there is formed a MOS transistor T which includes the gate electrode 25 and the pair of source and drain regions 26a, 26b. Then, as shown in FIG. 20, a silicon oxide film 28 is formed on the semiconductor substrate 21 so as to cover the MOS transistor T.

Figure 21:
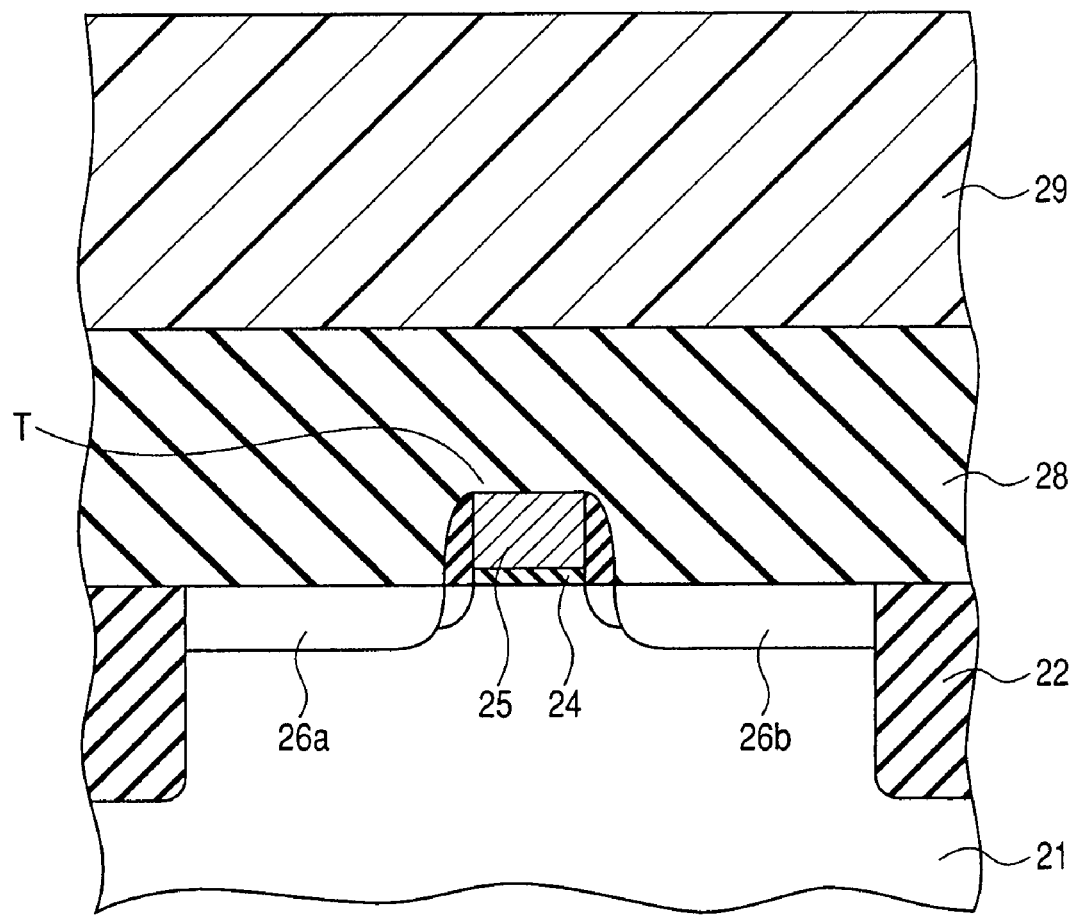
FIG. 21 is a sectional view showing a step which follows the step of FIG. 20 in the second embodiment.
Figure 22:
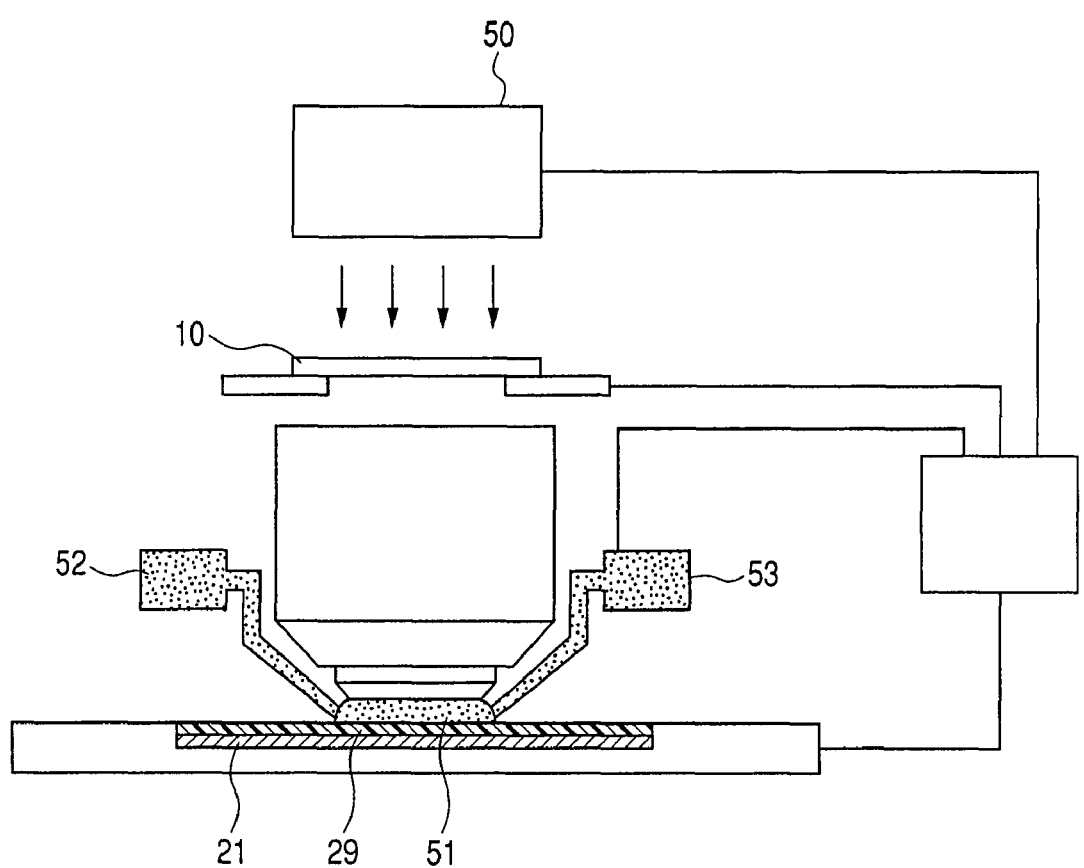
FIG. 22 is a side view partially including a section and showing an exposure processing which is performed by an immersion exposure tool after the step of FIG. 21 in the second embodiment.
Figure 23:
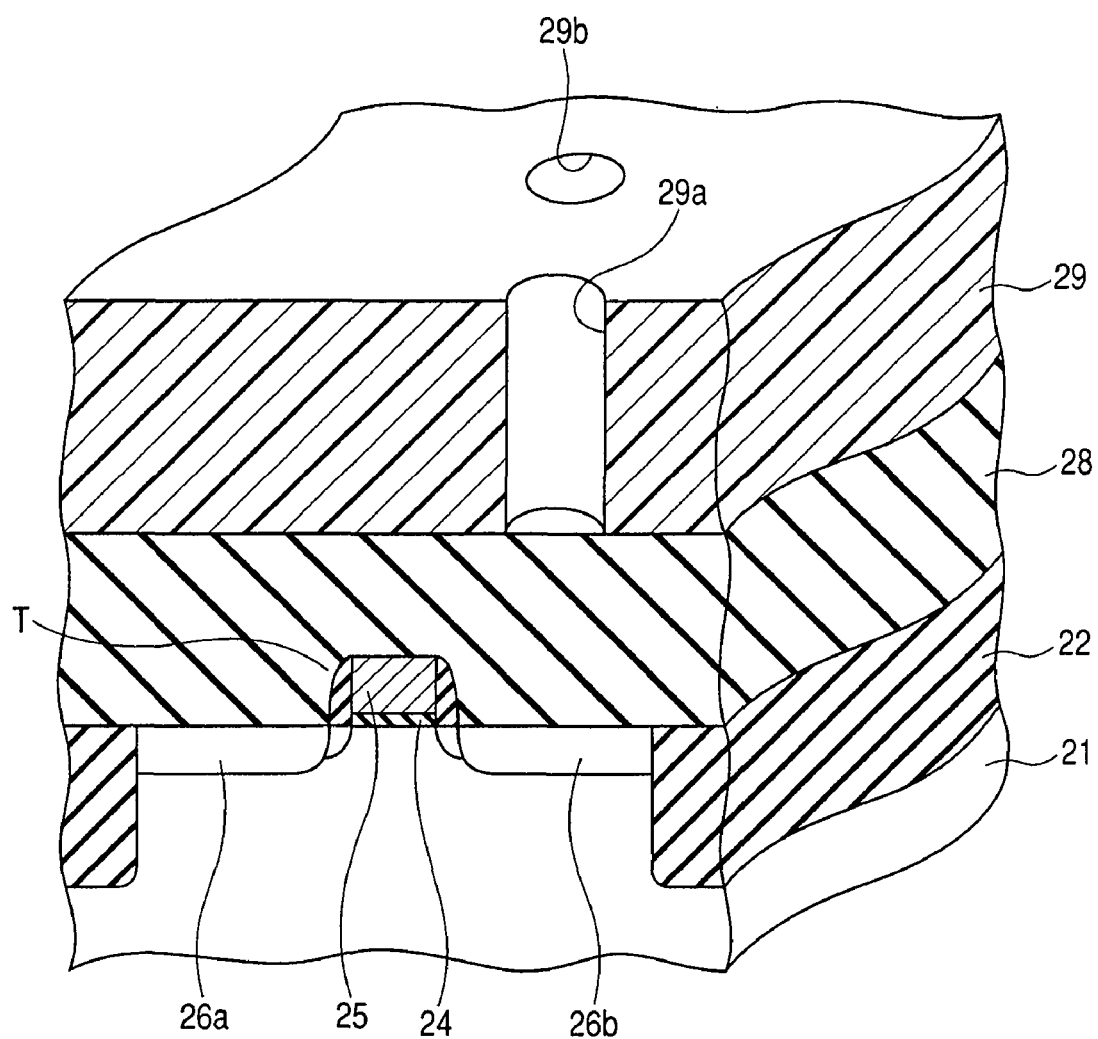
FIG. 23 is a sectional perspective view showing a step which follows the step of FIG. 22 in the second embodiment.

Then, as shown in FIG. 21, a multilayer resist film structure 29 is stacked on the silicon oxide film 28. Subsequently, an exposure of certain mask patterns is performed for an upper resist film layer in the multilayer resist film structure 29. At this time, as shown in FIG. 22, there are used a halftone phase shifting mask 10 including the foregoing aperture patterns and an immersion exposure tool 50. In the immersion exposure tool 50, water 51 is supplied as immersion water from a supply section 52 to between the photoresist 29 and a lens. Thereafter, the water 51 is recovered as drain by a recovery section 53. With the water 51 supplied to between the photoresist 29 and the lens, the upper resist film layer is subjected to an exposure treatment under certain exposure conditions (e.g., exposure wavelength 193 nm, NA=1.3, quadrupole illumination: sigma center=0.85, sigma radius=0.1).

By thus developing the upper resist film layer having been subjected to the exposure treatment and by subsequent transfer to a lower film layer in the multilayer resist film structure there are formed apertures 29a and 29b in the multilayer resist film structure 29. Although the aperture patterns in the halftone phase shifting mask are rectangular in shape, the apertures formed in the multilayer resist film structure 29 were generally circular.

Figure 24:
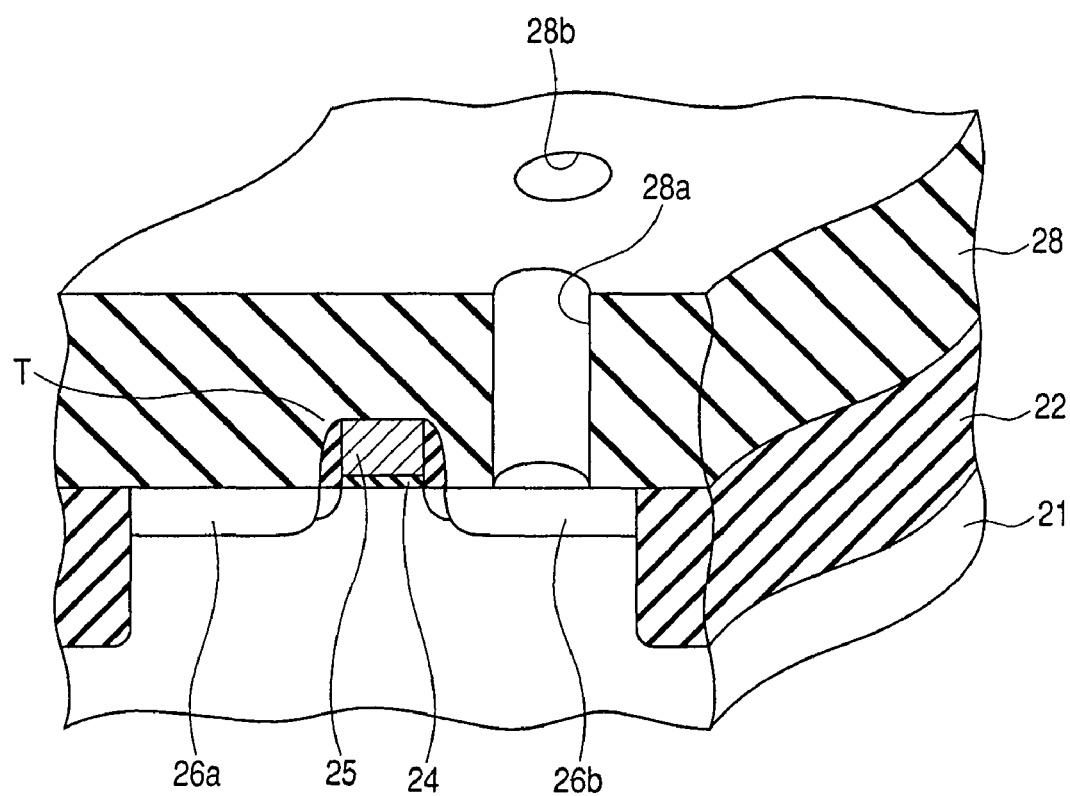
FIG. 24 is a sectional perspective view showing a step which follows the step of FIG. 23 in the second embodiment.

Next, by performing anisotropic dry etching for the silicon oxide film 28, using as a mask the multilayer resist film structure 29 formed with apertures 29a and 29b, there are formed apertures 28a and 28b to which the surface of the source and drain region 26a, 26b and that of gate wiring 33 are exposed respectively (see FIG. 24). Thereafter, the multilayer resist film structure 29 is removed.

Figure 25:
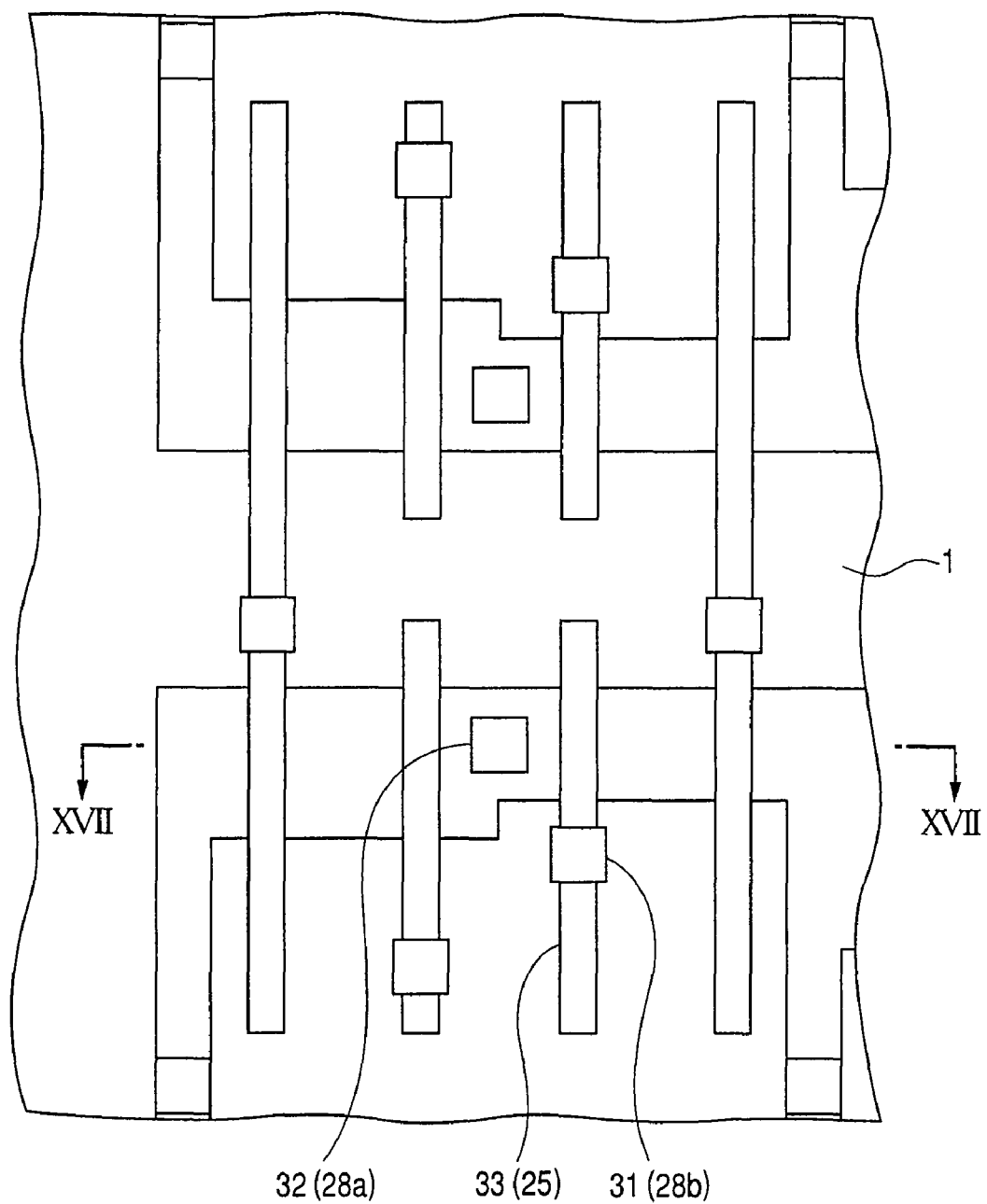
FIG. 25 is a schematic plan view of a circuit pattern layout in the second embodiment.

Then, contact plugs 32 and 31 (see FIG. 25) of a certain conductive material are formed in the apertures 28a and 28b, respectively. The contact plugs 31 and 32 are electrically coupled to the gate wiring 33 and the source and drain region 26a, 26b, respectively. In this way there is formed a principal portion of the semiconductor device provided with the MOS transistor.

In the semiconductor device manufacturing method described above there is used the foregoing halftone phase shifting mask having aperture patterns disposed obliquely with respect to the X axis like the layout relation between the contact hole for conduction with a source and drain region in the MOS transistor and the contact hole for conduction with gate wiring, whereby the aperture pattern size can be made larger.

As a result, it is not only possible to obtain a desired resist pattern size but also possible to improve the contrast of an optical image, thus permitting both improvement of resolution and enlargement of the process margin. Moreover, two adjacent rectangular aperture patterns can be drawn closer to each other, thus making it possible to narrow the wiring-to-wiring pitch and also the transistor pitch. That is, it is possible to make contribution to the reduction in size of the semiconductor device.

In the above semiconductor device manufacturing method reference has been made to an example of a layout relation between a contact hole for conduction with a source and drain region in the MOS transistor and a contact hole for conduction with gate wiring. However, in the halftone phase shifting mask in question, no limitation is made to the aforesaid layout of aperture patterns. The semiconductor device manufacturing method is applicable widely to aperture patterns disposed in such a manner that two adjacent aperture patterns are oblique with respect to the X axis.

In each of the above embodiments, the dimensions on the mask are dimensions determined in accordance with a reduction ratio unless otherwise specified. For example, in the case where the mask dimension is 80 nm, an actual size in the mask for a ¼ reduced projection exposure unit is 320 nm. The dimensions on the mask are described herein to be unified as design dimensions.

The above embodiments are illustrative and constitute no limitation. The scope of the present invention is defined not by the above description but by the scope of claims. It is intended that all changes made in the sense and scope equal to the scope of claims are included in the invention.

What is claimed is:

1. A method for manufacturing a mask which is forming certain patterns by photolithography to a photosensitive material film formed on a substrate, comprising the steps of:
   extracting, out of rectangular aperture patterns having pattern edges parallel to an X axis and pattern edges parallel to a Y axis orthogonal to the X axis in an XY plane defined by the X and Y axes, two rectangular aperture patterns adjacent each other in a state in which a line segment joining the center of one of the rectangular aperture patterns and the center of the other rectangular aperture pattern is inclined with respect to the X axis;
   rotating each of the thus-extracted two rectangular aperture patterns at a certain angle in such a manner that a pattern edge corresponding to one side of one of the rectangular aperture patterns and a pattern edge corresponding to one side of the other rectangular aperture pattern are opposed in parallel to each other and can be spaced apart the longest distance;

subjecting each of the two rectangular aperture patterns rotated at a certain angle to optical proximity effect correction to form two corrected aperture patterns; and performing, on the basis of the two corrected aperture patterns, electron beam exposure on a radiation sensitive resist material film stacked on a mask member formed on a certain substrate, thereby forming rectangular mask aperture patterns corresponding to the two corrected aperture patterns.

2. A method for manufacturing a mask according to claim 1, further comprising, between the step of rotation at a certain angle and the step of forming the corrected aperture patterns, the step of forming non-resolvable aperture patterns around the two rectangular aperture patterns over the photosensitive material film.

3. A method for manufacturing a mask according to claim 1, further comprising, before the step of rotation at a certain angle, the step of forming non-resolvable aperture patterns around the two rectangular aperture patterns over the photosensitive material film.

4. A method for manufacturing a mask according to claim 1, wherein the certain angle is an angle set on the basis of an angle between the line segment joining the centers of the two adjacent rectangular aperture patterns and the X axis.

5. A method for manufacturing a mask according to claim 1, wherein the certain angle is 45°.

* * * * *